United States Patent
Jo et al.

(10) Patent No.: US 12,332,307 B2
(45) Date of Patent: Jun. 17, 2025

(54) TRANSMITTER FOR ULTRA-HIGH SPEED AND STORAGE DEVICE INCLUDING THE SAME

(71) Applicant: SAMSUNG ELECTRONICS CO., LTD., Suwon-si (KR)

(72) Inventors: Ikjin Jo, Suwon-si (KR); Jaewoo Park, Suwon-si (KR); Jueon Kim, Suwon-si (KR); Myoungbo Kwak, Suwon-si (KR); Junghwan Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 55 days.

(21) Appl. No.: 18/325,162

(22) Filed: May 30, 2023

(65) Prior Publication Data
US 2024/0168091 A1    May 23, 2024

(30) Foreign Application Priority Data

Nov. 21, 2022 (KR) .................. 10-2022-0156033

(51) Int. Cl.
*G01R 31/317* (2006.01)
*G01R 31/319* (2006.01)

(52) U.S. Cl.
CPC . *G01R 31/31727* (2013.01); *G01R 31/31726* (2013.01); *G01R 31/31926* (2013.01)

(58) Field of Classification Search
CPC ........ G01R 31/31727; G01R 31/31926; G01R 31/31726
See application file for complete search history.

(56) References Cited

U.S. PATENT DOCUMENTS

| | | | |
|---|---|---|---|
| 7,746,251 B2 | 6/2010 | Gonzalez | |
| 8,264,906 B2 | 9/2012 | Chiu | |
| 10,114,074 B2 | 10/2018 | Loke et al. | |
| 10,374,615 B2 | 8/2019 | Moriai | |
| 11,165,554 B1 * | 11/2021 | Huss | G06F 1/04 |
| 2006/0100801 A1 * | 5/2006 | Tabatabaei | G01R 31/31709 |
| | | | 702/69 |

(Continued)

FOREIGN PATENT DOCUMENTS

| | | |
|---|---|---|
| JP | 20100213204 | 9/2010 |
| JP | 20130004131 | 1/2013 |

(Continued)

*Primary Examiner* — Samir W Rizk
(74) *Attorney, Agent, or Firm* — MORGAN, LEWIS & BOCKIUS LLP

(57) ABSTRACT

A transmitter includes a data generator, a serializer, a transmission driver and a feedback circuit. The data generator generates a retimed data signal and retimed test data by adjusting a delay amount of each of an input data signal and a test data based on adjusted clock signals. The serializer generates a serial data signal by serializing the retimed data signal based on multi-phase clock signals. The transmission driver generates an output data signal based on the serial data signal and transmits the output data signal through a channel. The feedback circuit detects the setup margin and the hold margin of the retimed test data through a separate path different from a path of the retimed data signal and generates the adjusted clock signals by adjusting delay amounts of the multi-phase clock signals based on the detected setup margin and hold margin of the retimed test data.

20 Claims, 28 Drawing Sheets

(56) References Cited

U.S. PATENT DOCUMENTS

| | | | | |
|---|---|---|---|---|
| 2007/0262800 | A1* | 11/2007 | Awaji | G01R 31/31725 327/164 |
| 2008/0126863 | A1* | 5/2008 | Co | G11C 29/56 714/E11.169 |
| 2015/0012674 | A1* | 1/2015 | Gil | G11C 7/1057 710/24 |
| 2015/0088437 | A1* | 3/2015 | Lin | G11C 29/56012 702/58 |
| 2019/0190627 | A1* | 6/2019 | Ho | G06F 11/08 |
| 2019/0199557 | A1* | 6/2019 | Taylor | G11C 7/1048 |
| 2020/0280467 | A1* | 9/2020 | Taylor | H04L 25/03343 |
| 2022/0343957 | A1* | 10/2022 | Yoon | G11C 29/52 |
| 2023/0054834 | A1* | 2/2023 | Manjunath | H04L 25/4917 |
| 2023/0336004 | A1* | 10/2023 | Spindler | H01M 10/441 |
| 2023/0344444 | A1* | 10/2023 | Seol | H04L 1/0009 |
| 2023/0377667 | A1* | 11/2023 | Lee | G11C 29/022 |
| 2023/0395105 | A1* | 12/2023 | Waldrop | G11C 7/1087 |

FOREIGN PATENT DOCUMENTS

| | | |
|---|---|---|
| JP | 20200188306 | 11/2020 |
| KR | 10-1121299 | 3/2012 |

\* cited by examiner

150

TRANSMITTER FOR ULTRA-HIGH SPEED AND STORAGE DEVICE INCLUDING THE SAME

CROSS-REFERENCE TO RELATED APPLICATIONS

This application claims priority under 35 USC § 119 to Korean Patent Application No. 10-2022-0156033, filed on Nov. 21, 2022, in the Korean Intellectual Property Office (KIPO), the disclosure of which is herein incorporated by reference in its entirety.

FIELD

Example embodiments relate generally to semiconductor integrated circuits, and more particularly to transmitters for ultra-high speed and storage devices including the same, capable of securing timing margin.

DISCUSSION

As memory bandwidth specifications intensify for high performance computing (HPC), such as in an artificial intelligence (AI) and a graphics processing unit (GPU), enlargement of the bandwidth may rely on innovation within the process technology. Developments in the process technology may create higher density integrated circuits (ICs).

Two-level pulse amplitude modulation (PAM-2) signaling, having two data modulation levels, may be used for data communications. Such PAM-2 signaling may make it possible to simplify the structure of a transceiver. However, only one bit may be transmitted during a unit interval (UI), and the clock frequency increases to increase bandwidth. For this reason, this may cause channel attenuation and deterioration of clock quality.

For a transmitter operating normally, there should be a sufficient setup and hold timing margin between a clock signal and a data signal. However, the set-up and hold timing margin generally decreases as a data transmission rate of the transmitter increases.

SUMMARY

An embodiment of the present disclosure provides a transmitter for ultra-high speed, capable of providing sufficient setup and hold timing margin when at least one of a process, a voltage and a temperature changes.

An embodiment of the present disclosure provides a storage device including a transmitter for ultra-high speed, capable of providing sufficient setup and hold timing margin when at least one of a process, a voltage and a temperature changes.

According to an embodiment, a transmitter includes: a pattern generator configured to generate test data having a predetermined pattern; a data generator configured to receive the generated test data and a data signal, generate retimed test data and a retimed data signal by adjusting a delay amount of each of the test data and the data signal based on adjusted clock signals; a serializer configured to generate a serial data signal by serializing the retimed data signal based on multi-phase clock signals; a transmission driver configured to generate an output data signal based on the serial data signal and transmit the output data signal through a channel; and a feedback circuit configured to detect a setup margin and a hold margin of the retimed test data through a separate path different from a path of the retimed data signal, and configured to generate the adjusted clock signals by adjusting delay amounts of the multi-phase clock signals based on the detected setup margin and the detected hold margin of the retimed test data.

According to an embodiment, a storage device includes a processor and a transmitter. The processor generates an input data signal. The transmitter generates test data, generates an output data signal having a target setup margin and a target hold margin by adjusting a delay amount of the input data signal based on the test data and transmits the output data signal to a host through a link. The transmitter includes a pattern generator, a data generator, a serializer, a transmission driver and a feedback circuit. The pattern generator generates the test data having a predetermined pattern. The data generator generates a retimed data signal and a retimed test data by adjusting a delay amount of each of the input data signal and the test data based on adjusted clock signals and each of the retimed data signal and the retimed test data has a setup margin and a hold margin that are adjusted. The serializer generates a serial data signal by serializing the retimed data signal based on multi-phase clock signals. The transmission driver generates the output data signal based on the serial data signal and transmits the output data signal through the link. The feedback circuit detects the setup margin and the hold margin of the retimed test data through a separate path different from a path of the retimed data signal and generates the adjusted clock signal by adjusting delay amounts of the multi-phase clock signals based on the detected setup margin and the detected hold margin of the retimed test data.

According to an embodiment, a transmitter for ultra-high speed includes a pattern generator, a data generator, a serializer, a transmission driver and a feedback circuit. The pattern generator generates test data having a predetermined pattern. The data generator generates a retimed data signal and a retimed test data by adjusting a delay amount of each of an input data signal and the test data based on adjusted clock signals. The serializer generates a serial data signal by serializing the retimed data signal based on multi-phase clock signals. The transmission driver generates an output data signal based on the serial data signal and transmits the output data signal through a channel. The feedback circuit detects the setup margin and the hold margin of the retimed test data through a separate path different from a path of the retimed data signal and generates the adjusted clock signals by adjusting delay amounts of the multi-phase clock signals based on the detected setup margin and the detected hold margin of the retimed test data. The feedback circuit includes a first dummy multiplexer, a second dummy multiplexer, a detection circuit, a control logic and a clock timing adjuster. The first dummy multiplexer provides a first output signal by sequentially selecting a first portion from among test bits of the retimed test data based on the multi-phase clock signals. The second dummy multiplexer provides a second output signal by sequentially selecting a second portion from among the test bits of the retimed test data based on the multi-phase clock signals, the second portion being different from the first portion. The detection circuit detects the setup margin and the hold margin of the retimed test data based on the first output signal, the second output signal and a strobe signal selected from among test bits of the test data and generates a detection signal indicating the detected setup margin and the detected hold margin of the retimed test data. The control logic generates a delay control signal based on the detection signal. The clock timing adjuster generates the adjusted clock signals by adjusting the delay amounts of the multi-phase clock signals based on the delay control signal.

Accordingly, a transmitter for ultra-high speed data transmission, according to an embodiment, adjusts, in real time, a setup margin and a hold margin of test data transferred through a path separate from a path through which a data signal is transferred, based on multi-phase clock signals, determines a lock point associated with a target setup margin and a target hold margin based on the setup margin and the hold margin, and transmits data signal having a delay at the lock point. Therefore, the transmitter may transmit the data signal stably even with a high data transmission rate.

BRIEF DESCRIPTION OF THE DRAWINGS

Illustrative, non-limiting embodiments of the present disclosure will be more clearly understood from the following detailed description taken in conjunction with the accompanying drawings.

DETAILED DESCRIPTION

Figure 1:
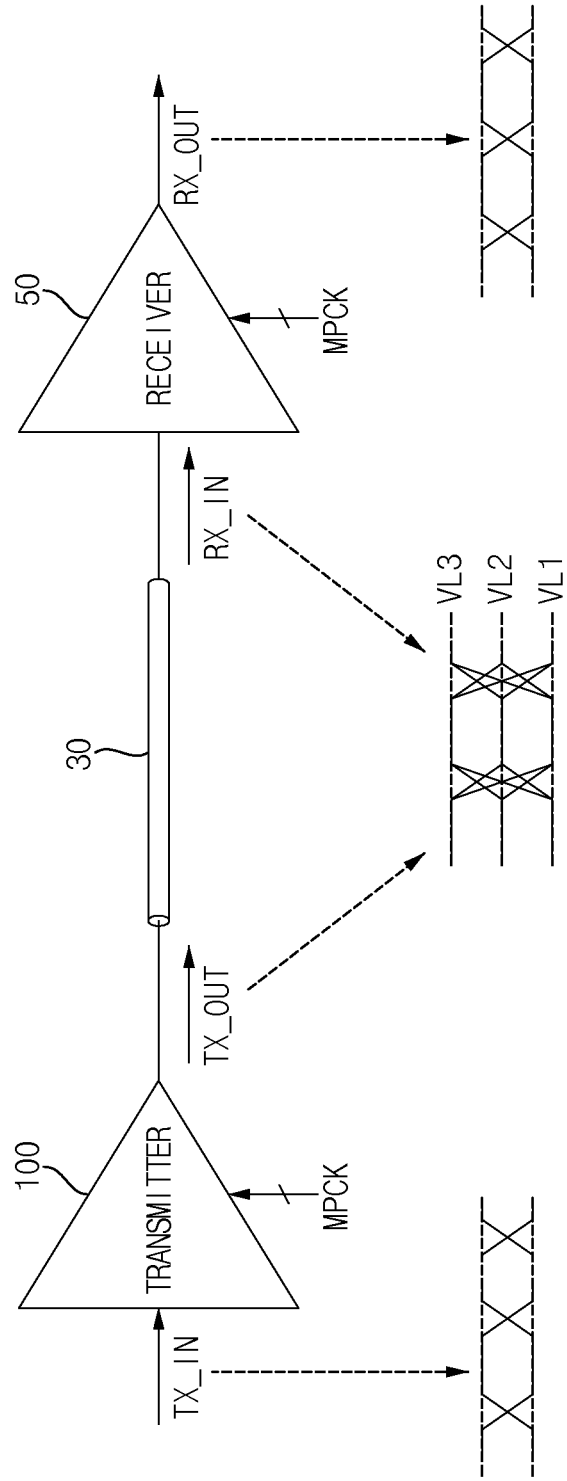
FIG. 1 is a block diagram illustrating a transmitter and a receiver according to an embodiment.

The present disclosure will be described more fully by way of example with reference to the accompanying drawings, in which illustrative embodiments are shown. The present disclosure may, however, be embodied in many different forms and should not be construed as limited to the illustrative embodiments set forth herein. Like reference numerals may refer to like elements throughout this specification.

A multi-level signaling scheme may be used as a means of compressing the bandwidth required to transmit data at a given bit rate. In a binary scheme, two single symbols, such as two voltage levels, may be used to represent '1' and '0,' and thus the symbol rate may be equal to the bit rate. In contrast, the principle of the multi-level signaling scheme may be to use a larger alphabet of m symbols to represent data, so that each symbol may represent more than one bit of data. As a result, the number of symbols that needs to be transmitted may be less than the number of bits (e.g., the bit rate may be greater than the symbol rate), and thus the bandwidth may be compressed.

In other words, such a multi-level signaling scheme may be used to increase a data transmission (or transfer) rate without increasing the frequency of symbol transmission and/or a transmission power of the communicated symbols. An example of one type of multi-level signaling scheme may be a pulse amplitude modulation (PAM) scheme, where each unique symbol of a multi-level signaling scheme may represent a plurality of bits of data.

FIG. 1 illustrates a transmitter and a receiver according to an embodiment.

Referring to FIG. 1, a transmitter 100 and a receiver 50 may be connected to each other through a communications line, link or channel 30.

The transmitter 100 may generate an output data signal TX_OUT based on an input data signal TX_IN including a plurality (e.g., three) of binary input bits and multi-phase clock signals MPCK. The output data signal TX_OUT may include a plurality (e.g., two) of three-level pulse amplitude modulation (PAM-3) symbols and each of the plurality of PAM-3 symbols may have a first voltage level VL1, a second voltage level VL2 and a third voltage level VL3. The output data signal TX_OUT may be transmitted to the receiver 50 through the channel 30. The receiver 200 may generate an output data signal RX_OUT including a plurality (e.g., three) of binary output bits based on an input data signal RX_IN including a plurality of PAM-3 symbols and the multi-phase clock signals MPCK.

For example, the three voltage levels of the output data signal TX_OUT may include a first voltage level VL1, a second voltage level VL2 higher than the first voltage level VL1, and a third voltage level VL3 higher than the second voltage level VL2. The first voltage level VL1, the second voltage level VL2 and the third voltage level VL3 may be referred to as a low level, a middle (or mid) level and a high level, respectively.

For example, the output data signal RX_OUT may have two voltage levels that are different from each other, and one value (or data) included in the output data signal RX_OUT, which is a binary signal, may represent one value (or bit) included in the input data signal TX_IN.

For example, each of the output data signal TX_OUT and the input data signal RX_IN may also have two voltage levels that are different from each other.

Figure 2:
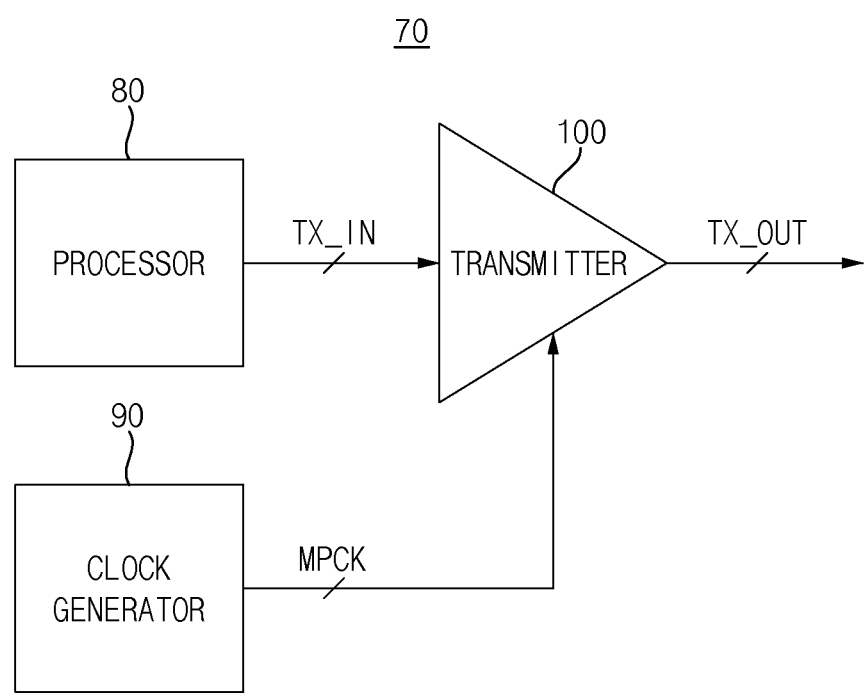
FIG. 2 is a block diagram of a device including a transmitter according to an embodiment.

FIG. 2 illustrates a device including a transmitter according to an embodiment.

Referring to FIG. 2, a device 70 may include a processor 80, a clock generator 90 and the transmitter 100.

The processor 80 may generate the input data signal TX_IN and may provide the input data signal TX_IN to the transmitter 100. The clock generator 90 may generate the multi-phase clock signals MPCK and may provide the multi-phase clock signals MPCK to the transmitter 100. In an embodiment, the clock generator 90 may include a phase-locked loop (PLL) circuit.

The transmitter 100 may convert the input data signal TX_IN into the output data signal TX_OUT based on the multi-phase clock signals MPCK, and may transmit the output data signal TX_OUT through a communications line, link or channel.

In an embodiment, the input data signal TX_IN may be a parallel data signal and the output data signal TX_OUT may be a serial data signal.

In an embodiment, the device 70 may be a volatile memory device or a storage device including a nonvolatile memory device.

Figure 3:
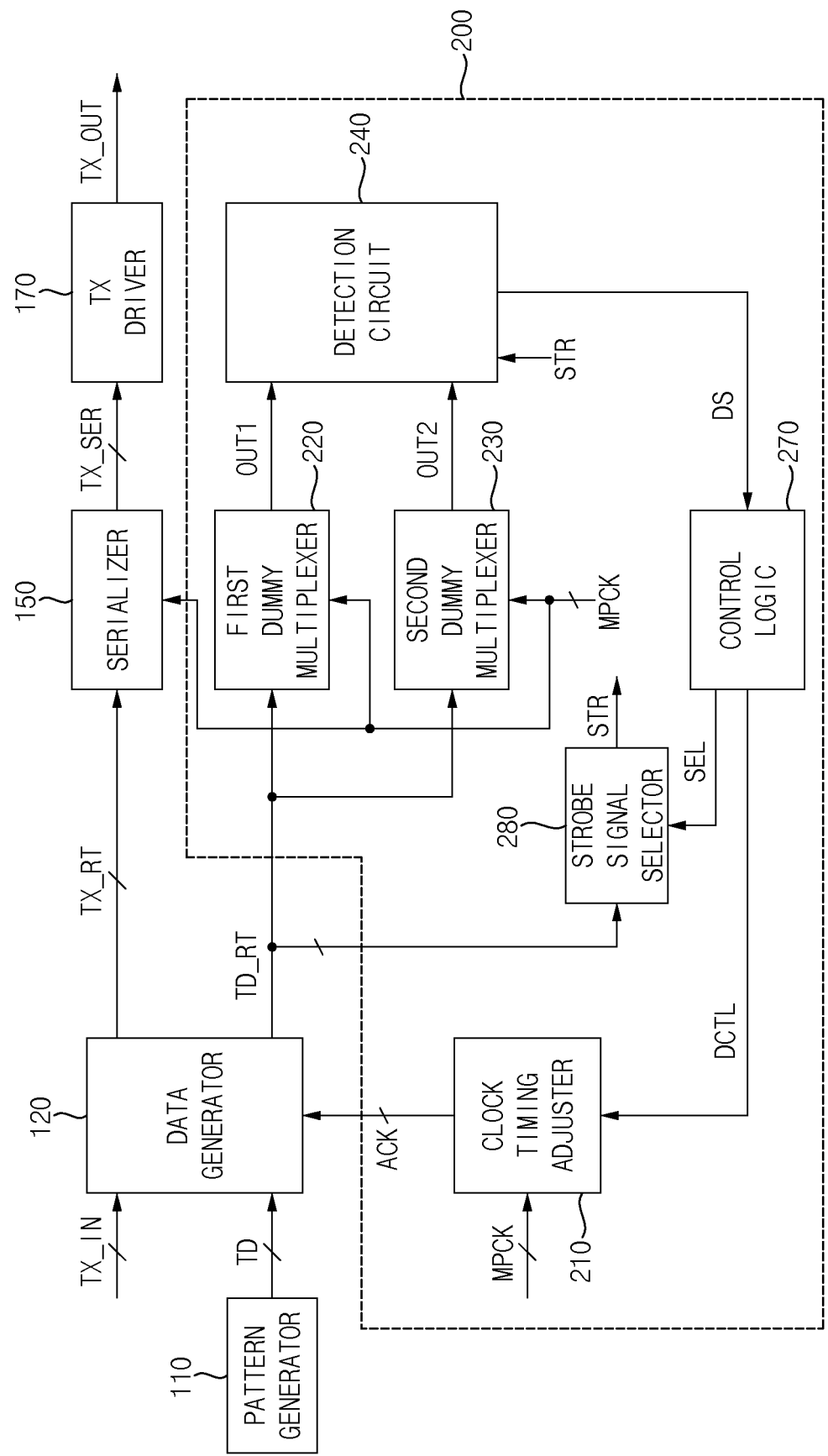
FIG. 3 is a block diagram illustrating an example of the transmitter of FIG. 1 according to an embodiment.

FIG. 3 illustrates an example of the transmitter of FIG. 1 according to an embodiment.

Referring to FIG. 3, the transmitter 100 may include a pattern generator 110, a data generator 120, a serializer 150, a transmission (TX) driver 170 and a feedback circuit 200.

The pattern generator 110 may generate test data TD having a predetermined pattern.

The data generator 120 may receive the input data signal TX_IN and the test data TD and may generate a retimed data signal TX_RT and a retimed test data TD_RT by adjusting a delay amount of each of the input data signal TX_IN and the test data TD based on adjusted clock signals ACK. Each of the retimed data signal TX_RT and the retimed test data TD_RT may have a setup margin and a hold margin that are adjusted.

The serializer 150 may generate a serial data signal TX_SER by serializing the retimed data signal TD_RT based on the multi-phase clock signals MPCK.

The transmission driver 170 may receive the serial data signal TX_SER, may generate the output data signal TX_OUT based on the serial data signal TX_SER and may transmit the output data signal TX_OUT through a communications line, link or channel.

The feedback circuit 200 may detect the setup margin and the hold margin of the retimed test data TD_RT, which are adjusted through a separate path different from a path of the retimed data signal TX_RT, and may generate the adjusted clock signals ACK by adjusting delay amounts of the multi-phase clock signals MPCK based on the detected setup margin and the detected hold margin of the retimed test data TD_RT. The feedback circuit 200 may provide the adjusted clock signals ACK to the data generator 120.

The feedback circuit 200 may adjust the delay amounts of the multi-phase clock signals MPCK until the retimed test data TD_RT has a target setup margin and a target hold margin and may fix and/or lock the delay amounts of the multi-phase clock signals MPCK in response to the timed test data TD_RT having the target setup margin and the target hold margin.

Because the data generator 120 converts the input data signal TX_IN to the retimed data signal TX_RT based on the adjusted clock signals ACK having variable delay amounts, the retimed data signal TX_RT may have the target setup margin and the target hold margin and the output data signal TX_OUT may have a jitter characteristic that is not degraded due to a change of at least one of a process, a voltage and a temperature.

The feedback circuit 200 may include a clock timing adjuster 210, a first dummy multiplexer 220, a second dummy multiplexer 230, a detection circuit 240, control logic 270 and a strobe signal selector 280.

The first dummy multiplexer 220 may provide a first output signal OUT1 by sequentially selecting a first portion from among test bits of the retimed test data TD_RT based on the multi-phase clock signals MPCK. The second dummy multiplexer 230 may provide a second output signal OUT2 by sequentially selecting a second portion different from the first portion, from among the test bits of the retimed test data TD_RT based on the multi-phase clock signals MPCK.

The detection circuit 240 may detect the setup margin and the hold margin of the retimed test data TD_RT based on the first output signal OUT1, the second output signal OUT2 and a strobe signal STR, may generate a detection signal DS indicating the detected setup margin and the detected hold margin of the retimed test data TD_RT and may provide the detection signal DS to the control logic 270.

The control logic 270 may generate a delay control signal DCTL based on the detection signal DS and may provide the delay control signal DCTL to the clock timing adjuster 210. In addition, the control logic 270 may provide a selection signal SEL to the strobe signal selector 280.

The clock timing adjuster 210 may receive the multi-phase clock signals MPCK and the delay control signal DCTL, may generate the adjusted clock signals ACK by adjusting the delay amounts of the multi-phase clock signals MPCK based on the delay control signal DCTL and may provide the adjusted clock signals ACK to the data generator 120.

The strobe signal selector 280 may receive the retimed test data TD_RT, may select one from among the test bits of the retimed test data TD_RT as the strobe signal STR and may provide the strobe signal STR to the detection circuit 240.

Figure 4:
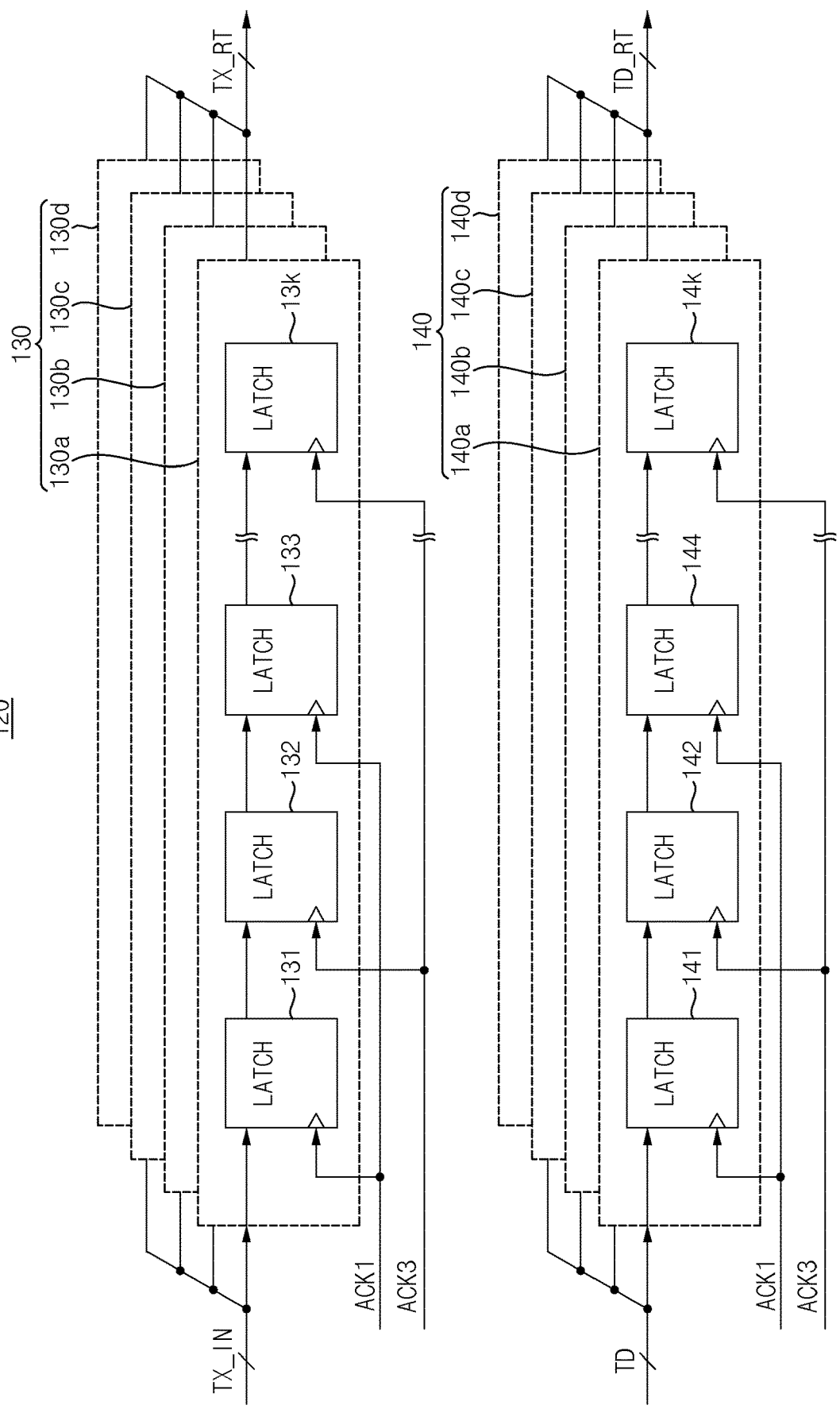
FIG. 4 is a block diagram illustrating an example of the data generator in the transmitter of FIG. 3 according to an embodiment.

FIG. 4 illustrates an example of the data generator in the transmitter of FIG. 3 according to an embodiment.

Referring to FIG. 4, the data generator 120 may include a first shift register block 130 and a second shift register block 140.

The first shift register block 130 may include a plurality of first shift registers 130a, 130b, 130c and 130d. The plurality of first shift registers 130a, 130b, 130c and 130d may generate the retimed data signal TX_RT by delaying data bits of the input data signal TX_IN in parallel based on a first adjusted clock signal ACK1 and a second adjusted clock signal ACK3 of the adjusted clock signals ACK. The first adjusted clock signal ACK1 and the second adjusted clock signal ACK3 may have a phase difference of 180 degrees with respect to each other.

The shift register 130a from among the plurality of first shift registers 130a, 130b, 130c and 130d may include a plurality of first latches 131, 132, 133, . . . , 13k which are connected in cascade. Here, k is an even natural number greater than three, such as four, six, eight or sixteen, without limitation thereto.

In an embodiment, k may be an odd natural number greater than three. For example, k may be nine to support one or more parity bits or the like.

The plurality of first latches 131, 132, 133, . . . , 13k may sequentially latch a corresponding data bit of the data bits of the input data signal TX_IN. First odd latches 131 and 133 of the plurality of first latches 131, 132, 133, . . . , 13k may receive the first adjusted clock signal ACK1 and may latch input data bits based on the first adjusted clock signal ACK1. First even latches 132 and 13k of the plurality of first latches 131, 132, 133, . . . , 13k may receive the second adjusted clock signal ACK3 and may latch input data bits based on the second adjusted clock signal ACK3.

A configuration of each of the first shift registers 130b, 130c and 130d may be substantially the same as a configuration of the shift register 130a. Substantially duplicate description may be omitted.

The second shift register block 140 may include a plurality of second shift registers 140a, 140b, 140c and 140d. The plurality of second shift registers 140a, 140b, 140c and 140d may generate the retimed test data TD_RT by delaying test bits of the test data TD in parallel based on the first adjusted clock signal ACK1 and the second adjusted clock signal ACK3 of the adjusted clock signals ACK.

The shift register 140a from among the plurality of second shift registers 140a, 140b, 140c and 140d may include a plurality of second latches 141, 142, 143, . . . , 14k which are connected in cascade. The plurality of first latches 141, 142, 143, . . . , 13k may sequentially latch a corresponding test bit of the test bits of the test data TD. Second odd latches 141 and 143 of the plurality of second latches 141, 142, 143, . . . , 14k may receive the first adjusted clock signal ACK1 and may latch input test bits based on the first adjusted clock signal ACK1. Second even latches 142 and 14k of the plurality of second latches 141, 142, 143, . . . , 14k may receive the second adjusted clock signal ACK3 and may latch input test bits based on the second adjusted clock signal ACK3.

A configuration of each of the second shift registers 140b, 140c and 140d may be substantially the same as a configuration of the shift register 140a. Substantially duplicate description may be omitted.

Figure 5:
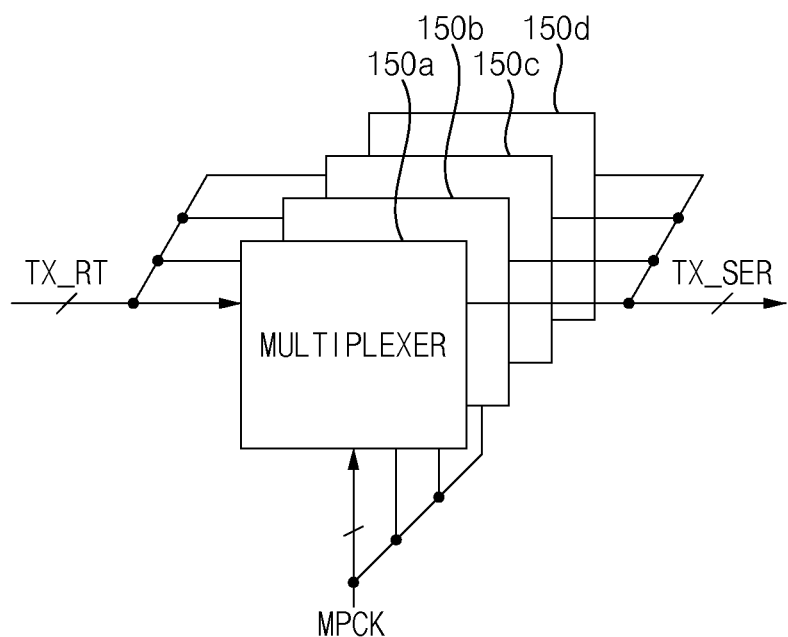
FIG. 5 is a block diagram illustrating an example of the serializer in the transmitter of FIG. 3 according to an embodiment.

FIG. 5 illustrates an example of the serializer in the transmitter of FIG. 3 according to an embodiment.

Referring to FIG. 5, the serializer 150 may include a plurality of multiplexers 150a, 150b, 150c and 150d.

The plurality of multiplexers 150a, 150b, 150c and 150d may operate in parallel to generate the serial data signal TX_SER by sequentially selecting the data bits of the retimed data signal TX_RT based on the multi-phase clock signals MPCK.

Figure 6:
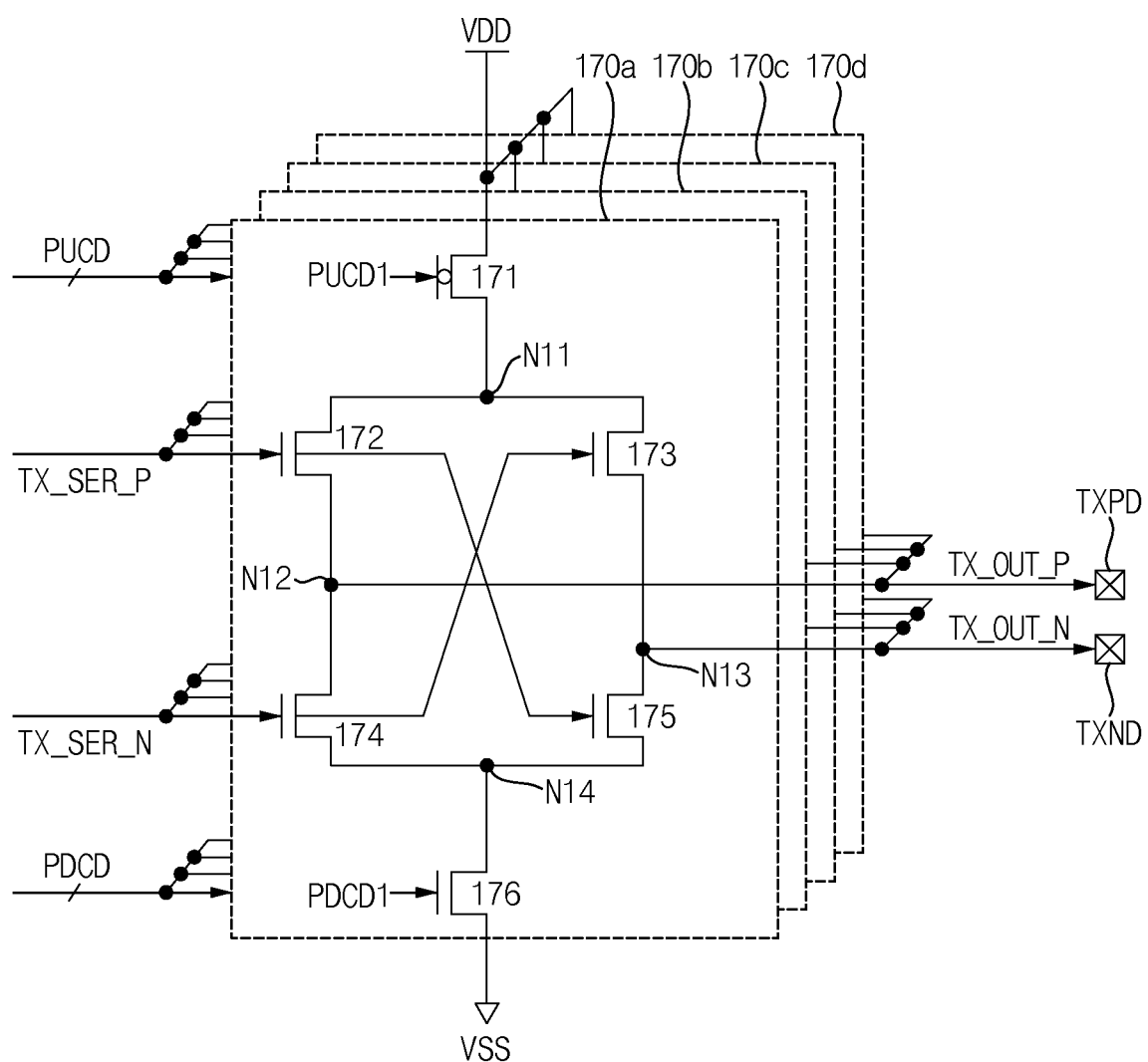
FIG. 6 is a circuit diagram illustrating an example of the transmission driver in the transmitter of FIG. 3 according to an embodiment.

FIG. 6 illustrates an example of the transmission driver in the transmitter of FIG. 3 according to an embodiment.

Referring to FIG. 6, the transmission driver 170 may include a plurality of driver segments 170a, 170b, 170c and 170d.

The plurality of driver segments 170a, 170b, 170c and 170d may be connected in parallel between a power supply voltage VDD and a ground voltage VSS and may receive in common a first subordinate data signal TX_SER_P of the serial data signal TX_SER and a second subordinate data signal TX_SER_N of the serial data signal TX_SER.

Of FIG. 6, a configuration of the driver segment 170a from among the plurality of driver segments 170a, 170b, 170c and 170d and each configuration of the driver segments 170b, 170c and 170d may be substantially the same as the configuration of the driver segment 170a. Substantially duplicate description may be omitted. In this embodiment, the serial data signal TX_SER is a differential signal, without limitation thereto.

The driver segment 170a may include a p-channel metal-oxide semiconductor (PMOS) transistor 171 and first through fifth n-channel metal-oxide semiconductor (NMOS) transistors 172, 173, 174, 175 and 176.

The PMOS transistor 171 may be connected between the power supply voltage VDD and a first node N11 and have a gate to receive a corresponding bit PUCD1 of a pull-up control code PUCD.

The first NMOS transistor 172 may be transistor connected between connected between the first node N11 and a second node N12 and have a gate to receive the first sub data signal TX_SER_P. The second NMOS transistor 173 may be connected between the first node N11 in parallel with the first NMOS transistor 172 and a third node N13 and have a gate to receive the second subordinate data signal TX_SER_N. The third NMOS transistor 174 may be connected between the second node N12 and a fourth node N14 and have a gate to receive the second subordinate data signal TX_SER_N. The fourth NMOS transistor 175 may be connected between the third node N13 and the fourth node N14 in parallel with the third NMOS transistor 174 and have a gate to receive the first subordinate data signal TX_SER_P.

The fifth NMOS transistor 176 may be connected between the fourth node N14 and the ground voltage VSS and have a gate to receive a corresponding bit PDCD1 of a pull-down control code PDCD.

A first component TX_OUT_P of the output data signal TX_OUT is provided to a first transmission pad TXPD at the second node N12 and the first component TX_OUT_P is transmitted to an external device through the channel 30. A second component TX_OUT_N of the output data signal TX_OUT is provided to a second transmission pad TXND at the third node N13 and the second component TX_OUT_N is transmitted to the external device through the channel 30.

The processor 80 of FIG. 2 may provide the pull-up control code PUCD and the pull-down control code PDCD.

Figure 7:
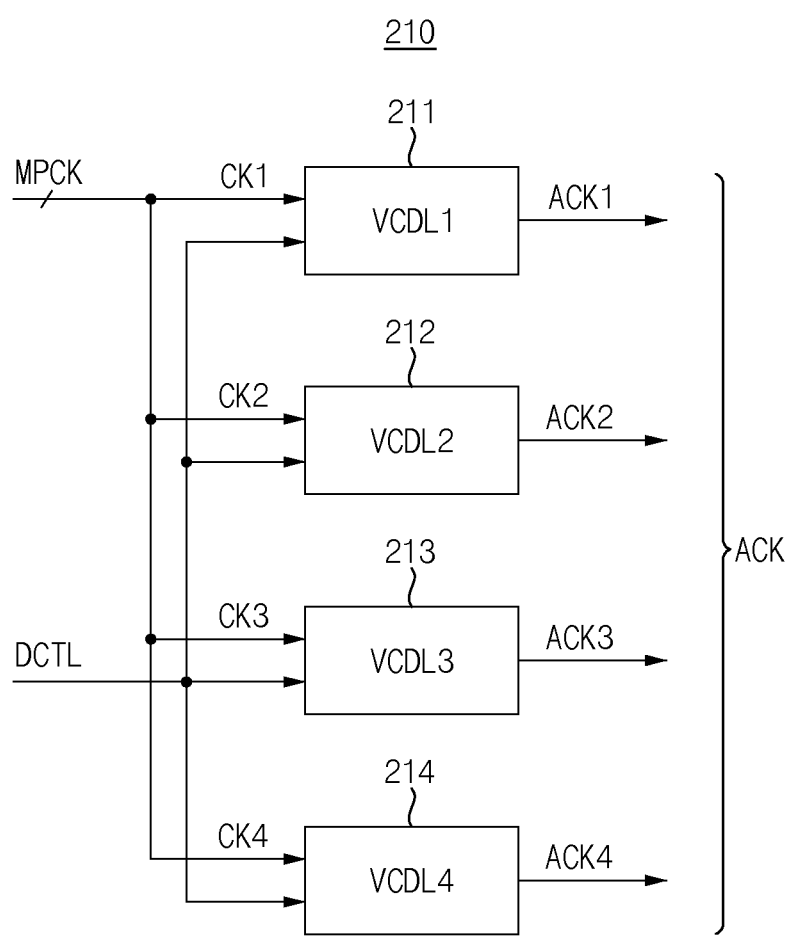
FIG. 7 is a block diagram illustrating an example of the clock timing adjuster in the transmitter of FIG. 3 according to an embodiment.

FIG. 7 illustrates an example of the clock timing adjuster in the transmitter of FIG. 3 according to an embodiment.

Referring to FIG. 7, the clock timing adjuster 210 may include a plurality of voltage-controlled delay lines (VCDL1, VCDL2, VCDL3 and VCDL4) 211, 212, 213 and 214.

Each of the plurality of voltage-controlled delay lines 211, 212, 213 and 214 may generate a corresponding one of adjusted clock signals ACK1, ACK2, ACK3 and ACK4 of the adjusted clock signals ACKs by adjusting a delay amount of each of clock signals CK1, CK2, CK3 and CK4, respectively, of the multi-phase clock signals MPCK based on the delay control signal DCTL.

In an embodiment, each of the plurality of voltage-controlled delay lines 211, 212, 213 and 214 may include a plurality of inverters which are connected in cascade.

In an embodiment, the clock timing adjuster 210 may include a plurality of digitally-controlled delay lines, without limitation thereto.

Figure 8:
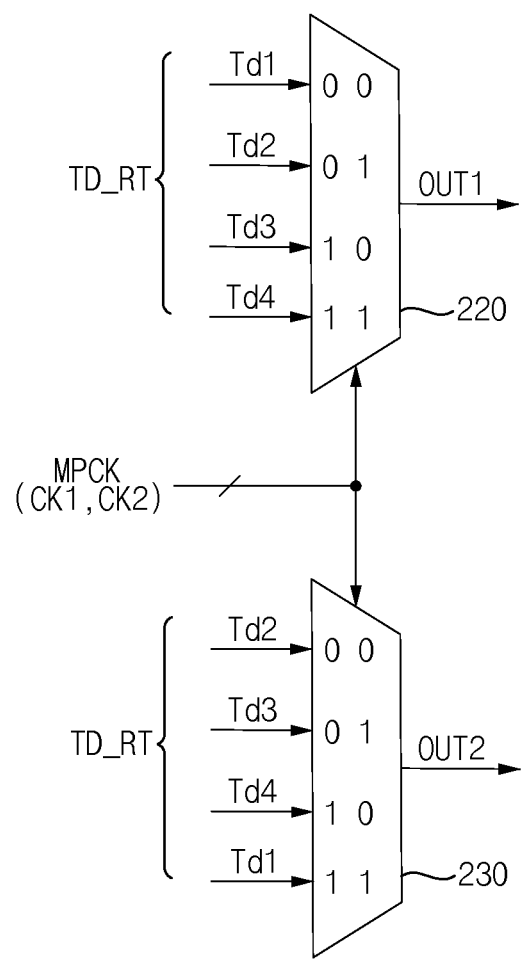
FIG. 8 is a circuit diagram that illustrates an example of the first dummy multiplexer and the second dummy multiplexer in the transmitter of FIG. 3 according to an embodiment.

FIG. 8 illustrates an example of the first dummy multiplexer and the second dummy multiplexer in the transmitter of FIG. 3 according to an embodiment.

In FIG. 8, the retimed test data TD-RT of FIG. 3 may include a first retimed test bit Td1, a second retimed test bit Td2, a third retimed test bit Td3 and a fourth retimed test bit Td4; and the first dummy multiplexer 220 and the second dummy multiplexer 230 may operate based on a first clock signal CK1 and a second clock signal CK2 which have a phase difference of 90 degrees, from among the multi-phase clock signals MPCK, without limitation thereto.

Referring to FIG. 8, the first dummy multiplexer 220 may provide the first output signal OUT1 by sequentially selecting, such as by using CK1 as a high-order selection line and CK2 as a low-order bit selection line, a first portion of the first retimed test bit Td1, the second retimed test bit Td2, the third retimed test bit Td3 and the fourth retimed test bit Td4 based on logic levels of the first clock signal CK1 and the second clock signal CK2; and the second dummy multiplexer 230 may provide the second output signal OUT2 by sequentially selecting a second portion of the second retimed test bit Td2, the third retimed test bit Td3, the fourth retimed test bit Td4 and the first retimed test bit Td1 based on logic levels of the first clock signal CK1 and the second clock signal CK2.

In an embodiment, the first dummy multiplexer 220 may provide the first output signal OUT1 by sequentially selecting a first portion of the retimed test data TD-RT based on logic levels of first through fourth clock signals CK1, CK2, CK3 and CK4 and the second dummy multiplexer 230 may provide the second output signal OUT2 by sequentially selecting a second portion of the retimed test data TD-RT based on logic levels of the first through fourth clock signals CK1, CK2, CK3 and CK4, where the second portion is different from the first portion.

Figure 9:
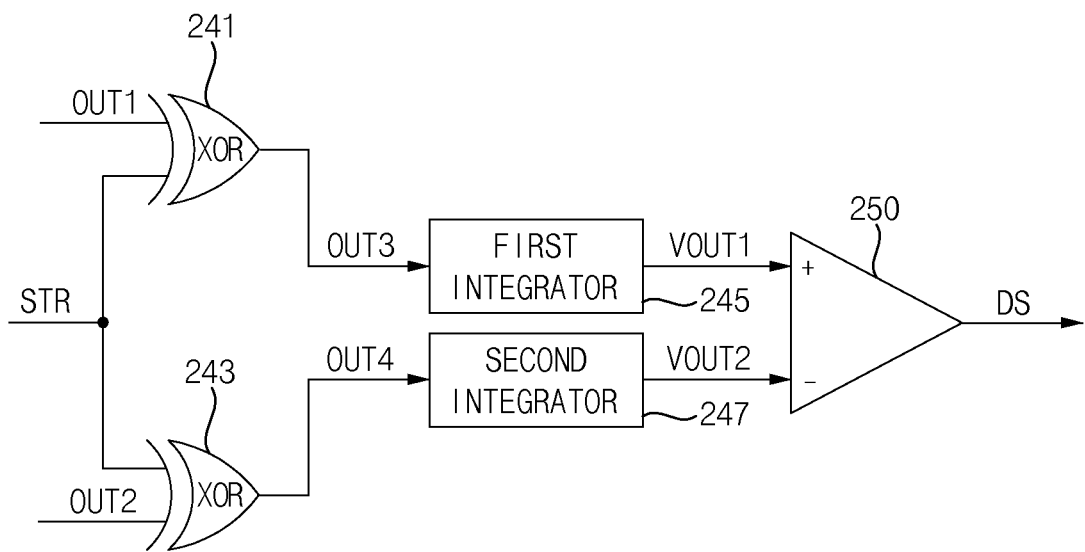
FIG. 9 is a circuit diagram illustrating an example of the detection circuit in the transmitter of FIG. 3 according to an embodiment.

FIG. 9 illustrates an example of the detection circuit in the transmitter of FIG. 3 according to an embodiment.

Referring to FIG. 9, the detection circuit 240 may include a first XOR gate 241, a second XOR gate 243, a first integrator 245 connected to the first XOR gate, a second integrator 247 connected to the second XOR gate, and a comparator 250 connected to the first and second integrators.

The first XOR gate 241 may generate a third output signal OUT3 by performing an XOR operation on the first output signal OUT1 and the strobe signal STR. The second XOR gate 243 may generate a fourth output signal OUT4 by performing an XOR operation on the second output signal OUT2 and the strobe signal STR.

The first integrator 245 may generate a first voltage signal VOUT1 corresponding to an analog signal by integrating the third output signal OUT3. The second integrator 247 may generate a second voltage signal VOUT2 corresponding to an analog signal by integrating the fourth output signal OUT4.

The first integrator 245 generates the first voltage signal VOUT1 corresponding to an analog signal by integrating the third output signal OUT3, where the third output signal OUT3 may have a first duty indicating a first skew between the retimed test data TD_RT and the multi-phase clock signals MPCK. The second integrator 247 generates the second voltage signal VOUT2 corresponding to an analog signal by integrating the fourth output signal OUT4, where the fourth output signal OUT4 may have a second duty indicating a second skew between the retimed test data TD_RT and the multi-phase clock signals MPCK.

The comparator 250 may have a positive input terminal to receive the first voltage signal VOUT1 and a negative input terminal to receive the second voltage signal VOUT2. The comparator 250 may generate the detection signal DS by subtracting the second voltage signal VOUT2 from the first voltage signal VOUT1. Therefore, the detection signal DS may have a magnitude and a slope which are based on magnitudes or voltage levels of the first voltage signal VOUT1 and the second voltage signal VOUT2.

The control logic 270 of FIG. 3 may determine, based on the detection signal, at least one skew from among a plurality of skews as at least one lock point, respectively, at which the first voltage signal VOUT1 and the second voltage signal VOUT2 intersect each other and the detection signal DS has a positive slope. The retimed data signal TX_RT may have a target setup margin and a target hold margin at the lock point.

In an embodiment, the lock point may vary based on the strobe signal STR output from the strobe signal selector 280 of FIG. 3. That is, the lock point may vary based on the strobe signal STR which the strobe signal selector 280 selects among from the test bits of the retimed test data TD_RT based on the selection signal SEL from the control logic 270.

In response to the detection signal DS indicating that the first voltage signal VOUT1 is greater than the second voltage signal VOUT2, the control logic 270 of FIG. 3 may generate the delay control signal DCTL such that the delay amount of the multi-phase clock signals MPCK decreases and the clock timing adjuster 210 of FIG. 3 may generate the adjusted clock signals ACK by decreasing the delay amount of the multi-phase clock signals MPCK in response to the delay control signal DCTL.

In response to the detection signal DS indicating that the first voltage signal VOUT1 is smaller than the second voltage signal VOUT2, the control logic 270 may generate the delay control signal DCTL such that the delay amount of the multi-phase clock signals MPCK increases and the clock timing adjuster 210 may generate the adjusted clock signals ACK by increasing the delay amount of the multi-phase clock signals MPCK in response to the delay control signal DCTL.

The control logic 270 may adjust the delay control signal DCTL such that the delay amount of the multi-phase clock signals MPCK is adjusted until the detection signal DS indicating the first voltage signal VOUT1 matches the second voltage signal VOUT2, and may lock the delay control signal DCTL in response to the first voltage signal VOUT1 matching the second voltage signal VOUT2.

Figure 10A:
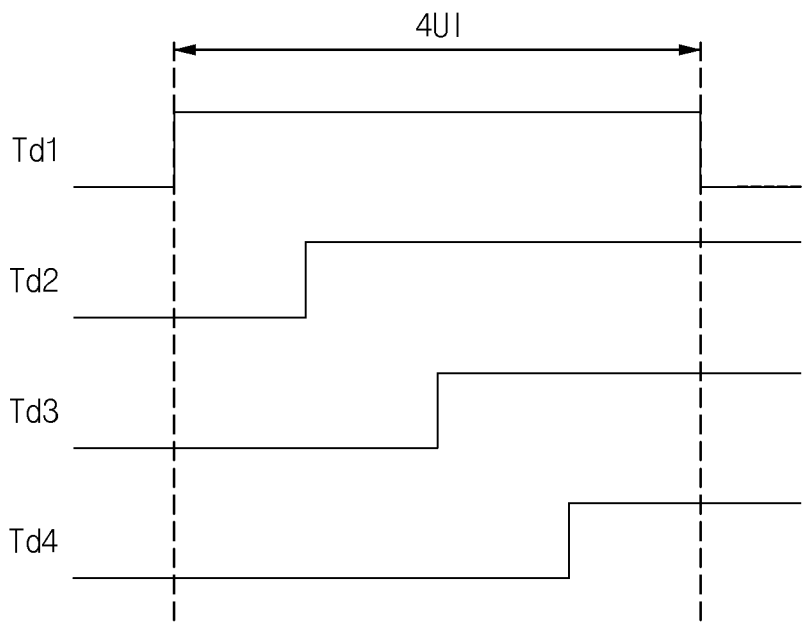
FIG. 10A is a signal timing diagram that illustrates an example of test bits of the test data.
Figure 10B:
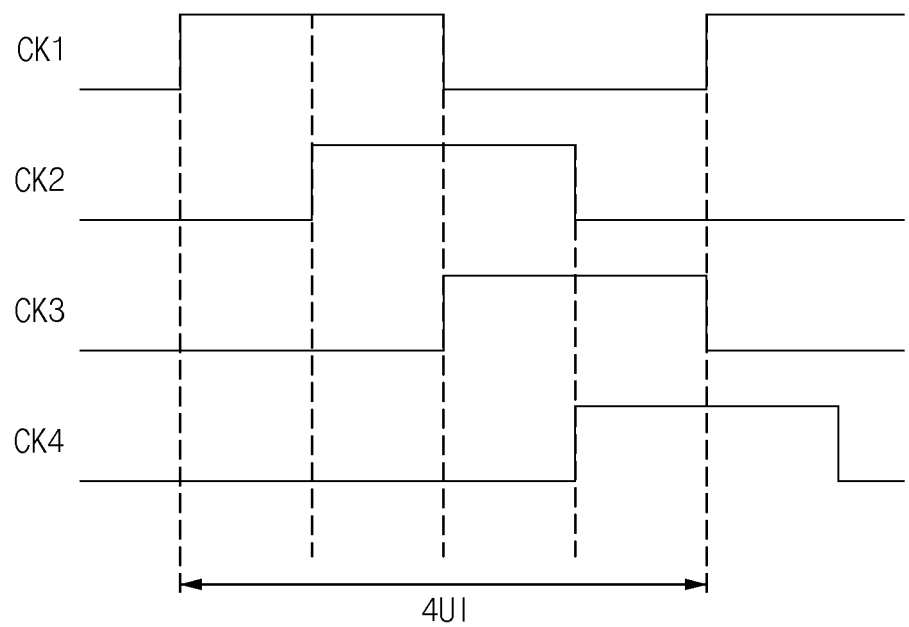
FIG. 10B is a signal timing diagram that illustrates an example of the multi-phase clock signals and FIG. 10C is a signal timing diagram that illustrates an example of the output data signal of FIG. 3, respectively.
Figure 10C:
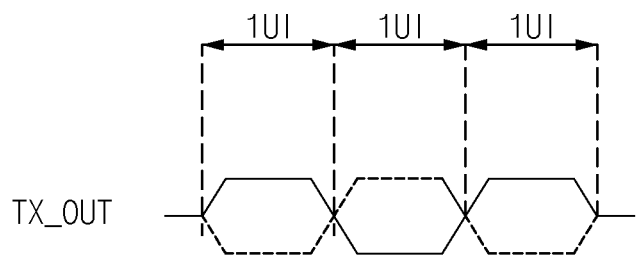

FIG. 10A illustrates an example of test bits of the test data, FIG. 10B illustrates an example of the multi-phase clock signals, and FIG. 10C illustrates an example of the output data signal of FIG. 3, respectively.

Referring to FIGS. 3, 10A, 10B and 10C, when a time interval for representing one value in the output data signal TX_OUT is defined as one unit interval (1 UI) as shown in FIG. 10C, a time interval for representing one value in each of the first, second, third and fourth test bits Td1, Td2, Td3 and Td4 may correspond to four unit intervals (4 UI) as shown in FIG. 10A. A period of each of the first, second, third and fourth clock signals CK1, CK2, CK3 and CK4 may also correspond to 4 UI as shown in FIG. 10B, where their respective phase offsets from CK1 are 90 degrees, 180 degrees and 270 degrees, respectively. In addition, the input data signal TX_IN may have a time interval for representing one value, which is the same as the time interval of each of the first, second, third and fourth test bits Td1, Td2, Td3 and Td4.

Figure 11:
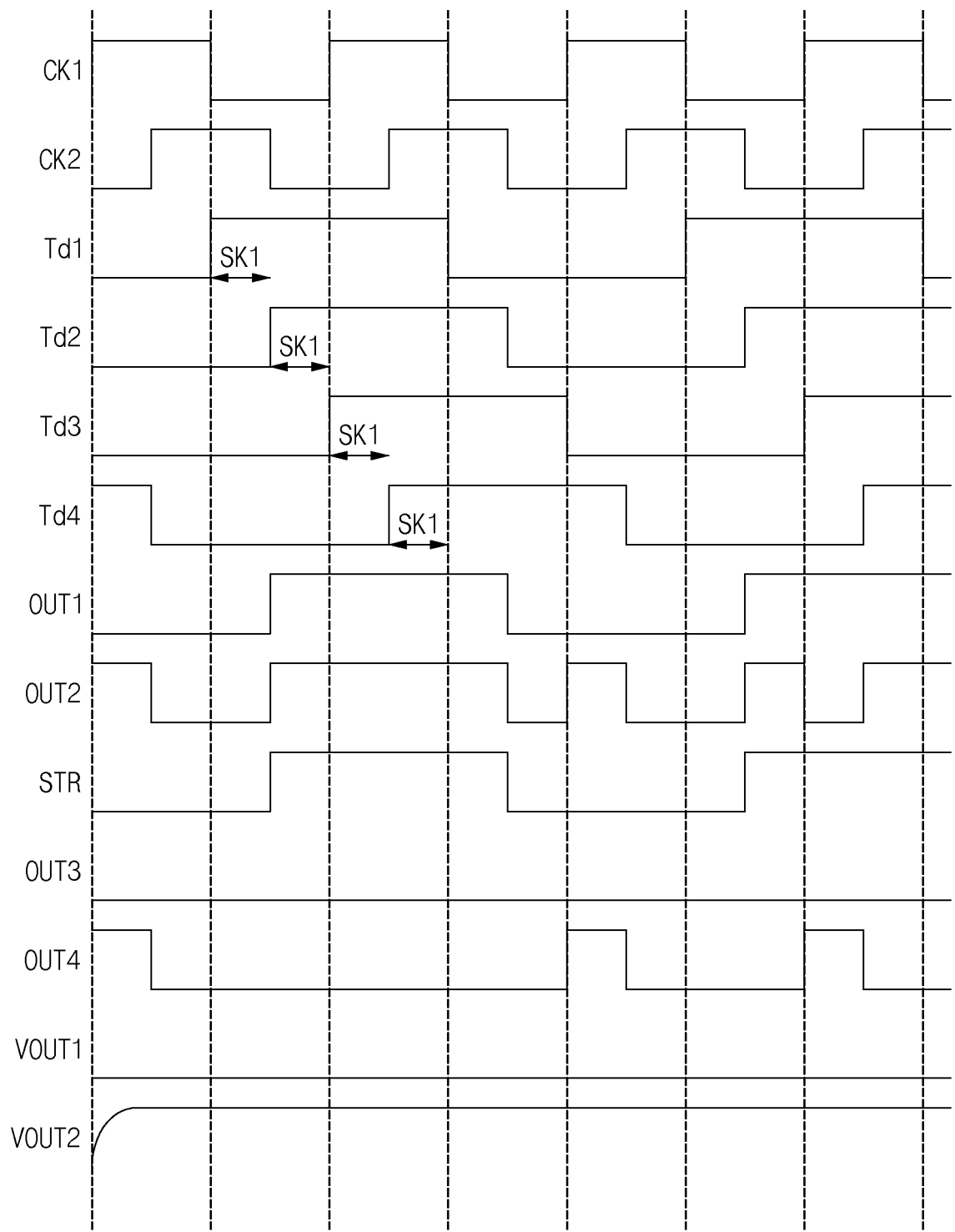
FIGS. 11, 12 and 13 are signal timing diagrams that illustrate an example of a skew between the multi-phase clock signals and the test bits in the dummy multiplexers of FIG. 8 and the detection circuit of FIG. 9, respectively.
Figure 12:
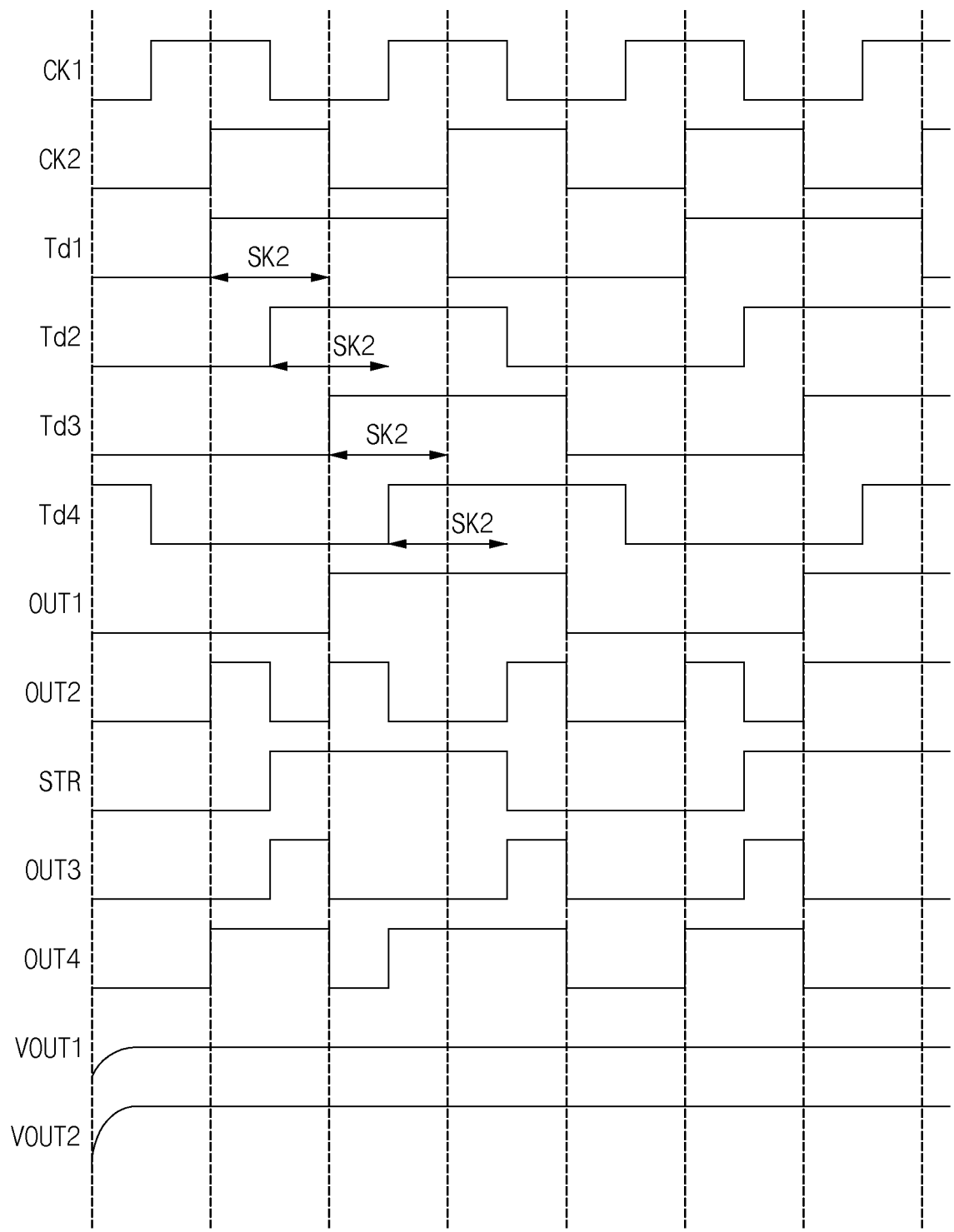
Figure 13:
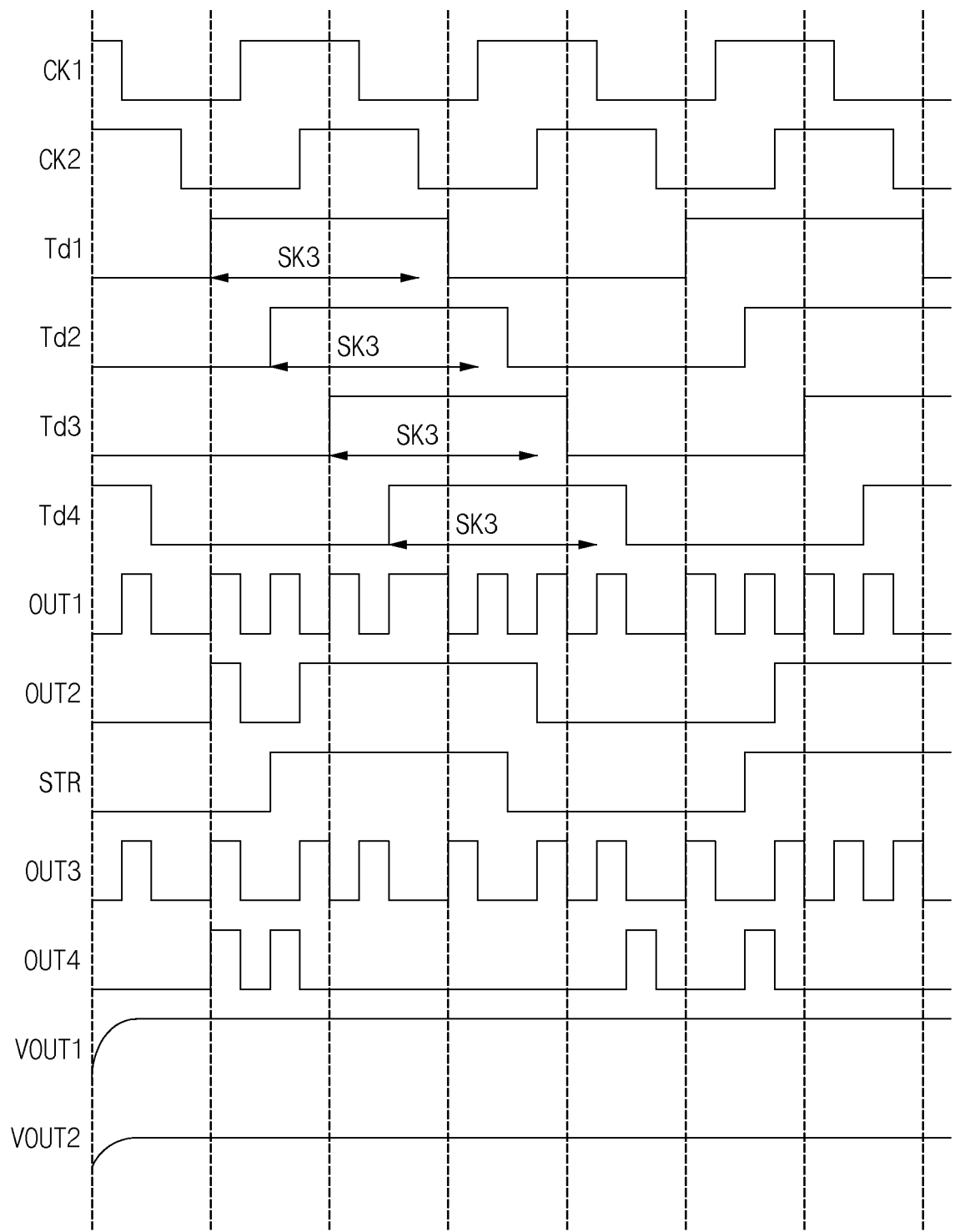

FIGS. 11, 12 and 13 illustrate an example of a skew between the multi-phase clock signals and the test bits in the dummy multiplexers of FIG. 8 and the detection circuit of FIG. 9, respectively.

In FIGS. 11, 12 and 13, the first dummy multiplexer 220 and the second multiplexer 230 receive the first clock signal CK1 and the second clock signal CK2 which have a phase difference of 90 degrees, from among the multi-phase clock signals MPCK, and the second test bit Td2 is selected as the strobe signal STR, without limitation thereto.

Referring to FIG. 11, a skew SK1 corresponding to 1 UI exists between a rising edge of the first retimed test bit Td1 and a falling edge of the second clock signal CK2, the second retimed test bit Td2 is delayed by 1 UI with respect to the first retimed test bit Td1, the third retimed test bit Td3 is delayed by 1 UI with respect to the second retimed test bit Td2 and the fourth retimed test bit Td4 is delayed by 1 UI with respect to the third retimed test bit Td3.

The first dummy multiplexer 220 provides the first output signal OUT1 by sequentially selecting one of the first, second, third or fourth retimed test bits Td1, Td2, Td3 or Td4 based on logic levels of the first clock signal CK1 and the second clock signal CK2 and the second dummy multiplexer 230 provides the second output signal OUT2 by sequentially selecting one of the second, third, fourth or first retimed test bits Td2, Td3, Td4 or Td1 based on logic levels of the first clock signal CK1 and the second clock signal CK2.

The first XOR gate 241 outputs the third output signal OUT3 by performing an XOR operation on the first output signal OUT1 and the strobe signal STR, and the first integrator 245 outputs the first voltage signal VOUT1 by integrating the third output signal OUT3. The second XOR gate 243 outputs the fourth output signal OUT4 by performing an XOR operation on the second output signal OUT2 and the strobe signal STR, and the second integrator 247 outputs the second voltage signal VOUT2 by integrating the fourth output signal OUT4.

Therefore, based on the first clock signal CK1, the second clock signal CK2, the retimed test bits Td1, Td2, Td3 and Td4, and the strobe signal STR; the first output signal OUT1, the second output signal OUT2, the third output signal OUT3, the fourth output signal OUT4, the first voltage signal VOUT1 and the second voltage signal VOUT2 may have waveforms as shown in FIG. 11.

The comparator 250 outputs the detection signal DS by comparing or subtracting the second voltage signal VOUT2 from the first voltage signal VOUT1.

Referring to FIG. 12, a skew SK2 corresponding to 2 UI exists between a rising edge of the first retimed test bit Td1 and a falling edge of the second clock signal CK2, the second retimed test bit Td2 is delayed by 2 UI with respect to the first retimed test bit Td1, the third retimed test bit Td3 is delayed by 2 UI with respect to the second retimed test bit Td2 and the fourth retimed test bit Td4 is delayed by 2 UI with respect to the third retimed test bit Td3.

Therefore, based on the first clock signal CK1, the second clock signal CK2, the retimed test bits Td1, Td2, Td3 and Td4, and the strobe signal STR; the first output signal OUT1, the second output signal OUT2, the third output signal OUT3, the fourth output signal OUT4, the first voltage signal VOUT1 and the second voltage signal VOUT2 may have waveforms as shown in FIG. 12.

The comparator 250 outputs the detection signal DS by comparing or subtracting the second voltage signal VOUT2 from the first voltage signal VOUT1.

Referring to FIG. 13, a skew SK3 corresponding to 3.5 UI exists between a rising edge of the first retimed test bit Td1 and a falling edge of the second clock signal CK2, the second retimed test bit Td2 is delayed by 3.5 UI with respect to the first retimed test bit Td1, the third retimed test bit Td3 is delayed by 3.5 UI with respect to the second retimed test bit Td2 and the fourth retimed test bit Td4 is delayed by 3.5 UI with respect to the third retimed test bit Td3.

Therefore, based on the first clock signal CK1, the second clock signal CK2, the retimed test bits Td1, Td2, Td3 and Td4, and the strobe signal STR; the first output signal OUT1, the second output signal OUT2, the third output signal OUT3, the fourth output signal OUT4, the first voltage signal VOUT1 and the second voltage signal VOUT2 may have waveforms as shown in FIG. 13.

The comparator 250 outputs the detection signal DS by subtracting the second voltage signal VOUT2 from the first voltage signal VOUT1.

Figure 14A:
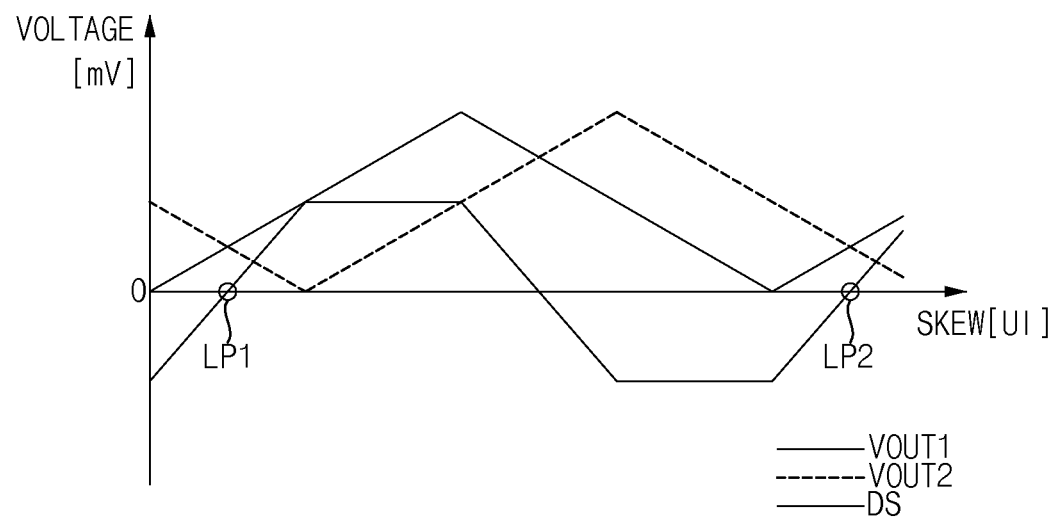
FIG. 14A is a signal timing diagram that illustrates examples of the first voltage signal, the second voltage signal and the detection signal in the detection circuit of FIG. 9 according to an embodiment.

FIG. 14A illustrates examples of the first voltage signal, the second voltage signal and the detection signal in the detection circuit of FIG. 9 according to an embodiment.

Referring to FIG. 14A, the control logic 270 of FIG. 3 determines, based on the detection signal, skews from among a plurality of skews as lock points LP1 and LP2, respectively, at which the first voltage signal VOUT1 and the second voltage signal VOUT2 intersect each other and the detection signal DS has a positive slope.

Of FIG. 14A, a horizontal axis denotes a skew and a horizontal axis denotes a voltage level of each of the first voltage signal VOUT1, the second voltage signal VOUT2 and the detection signal DS with mV.

Figure 14B:
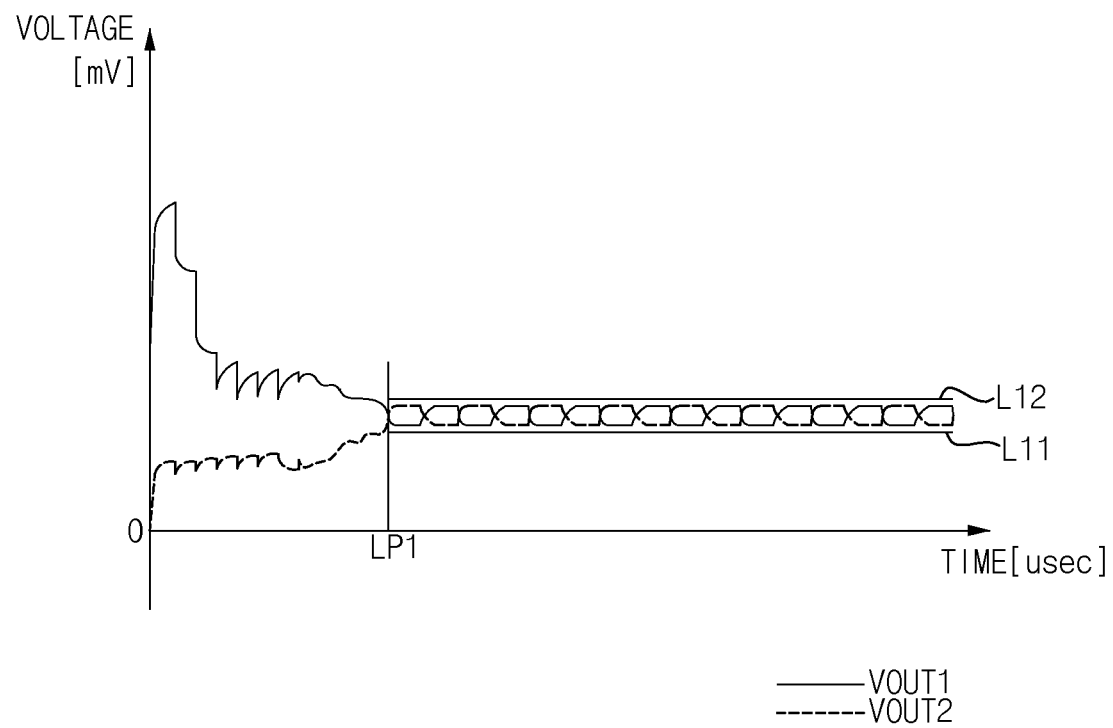
FIG. 14B is a signal timing diagram that illustrates the first voltage signal and the second voltage signal around the lock point of FIG. 14A.

FIG. 14B illustrates the first voltage signal and the second voltage signal around the lock point of FIG. 14A.

Referring to FIG. 14B, when a time elapses from the lock point LP1 at which the first voltage signal VOUT1 and the second voltage signal VOUT2 intersect, a voltage difference between the first voltage signal VOUT1 and the second voltage signal VOUT2 is maintained within a specific range between a first level L11 and a second level L12.

Figure 15:
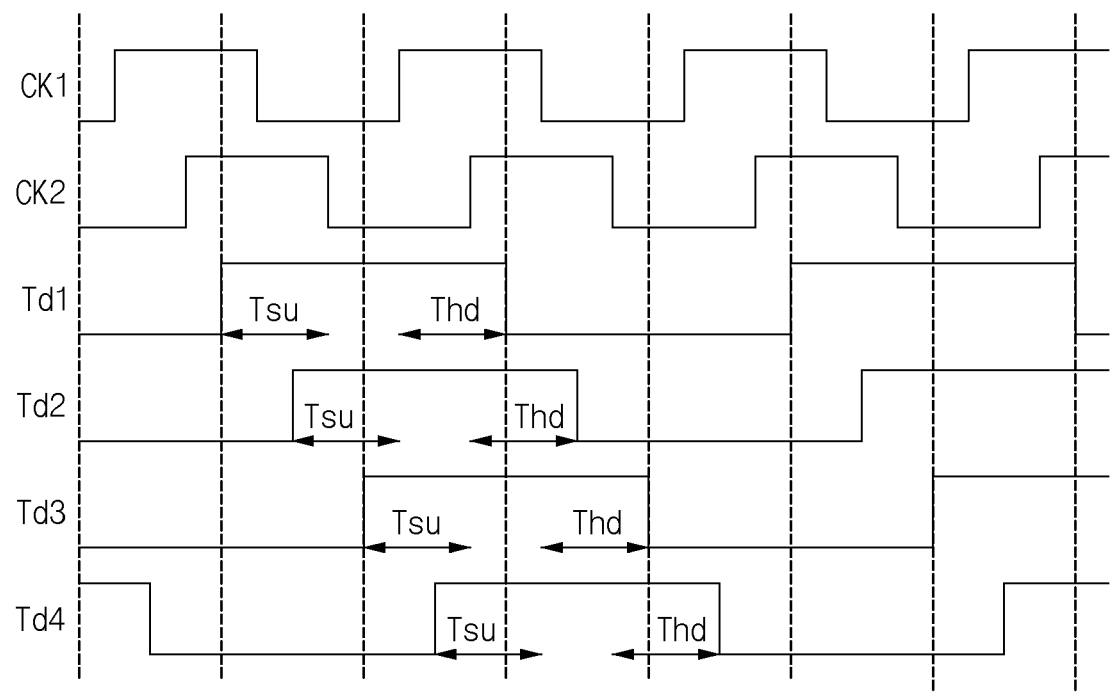
FIG. 15 is a signal timing diagram that illustrates examples of skews between the multi-phase clock signals and the test bits at a lock point.

FIG. 15 illustrates examples of skews between the multi-phase clock signals and the test bits at a lock point.

Referring to FIG. 15, a skew corresponding to 1.5 UI exists between a rising edge of the first retimed test bit Td1 and a falling edge of the second clock signal CK2, the second retimed test bit Td2 is delayed by 1 UI with respect to the first retimed test bit Td1, the third retimed test bit Td3 is delayed by 1 UI with respect to the second retimed test bit Td2 and the fourth retimed test bit Td4 is delayed by 1 UI with respect to the third retimed test bit Td3.

Therefore, each of the first, second, third and fourth retimed test bits Td1, Td2, Td3 and Td4 of the retimed test data TD_RT may have a target setup margin Tsu corresponding to 1.5 UI and a target hold margin Thd corresponding to 1.5 UI. Because the retimed data signal TX_RT has the same target setup margin and the same target hold margin as the target setup margin and the target hold margin of the retimed test data TD_RT, the retimed data signal TX_RT may have a target setup margin Tsu corresponding to 1.5 UI and a target hold margin Thd corresponding to 1.5 UI.

FIGS. 16A, 16B, 16C and 16D illustrate that the lock point varies based on the strobe signal which the strobe signal selector of FIG. 3 selects, respectively.

In each of FIGS. 16A, 16B, 16C and 16D, a horizontal axis denotes a skew in units of UI and a vertical axis denotes a voltage level of each of the first voltage signal VOUT1, the second voltage signal VOUT2 and the detection signal DS in units of millivolts (mV).

Figure 16A:
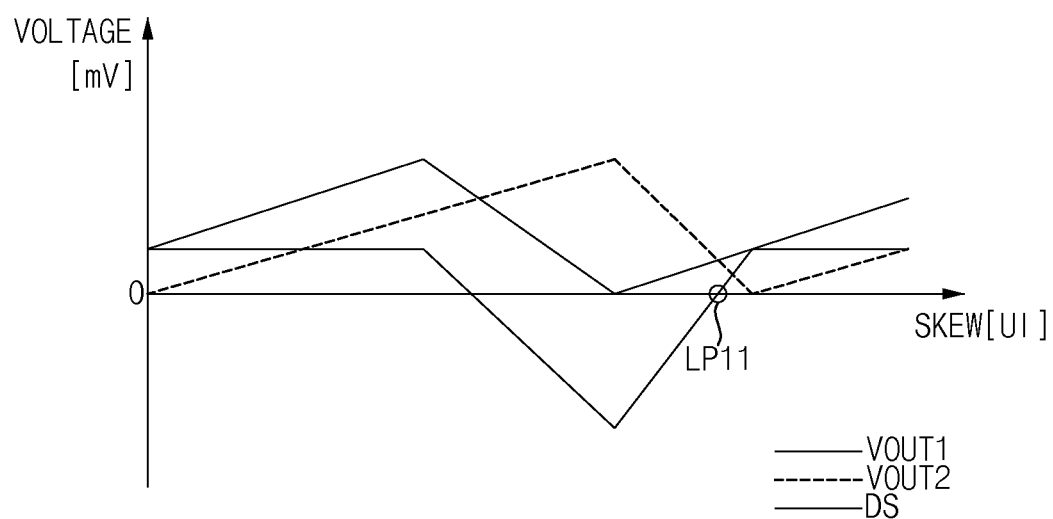
FIGS. 16A, 16B, 16C and 16D are signal timing diagrams that illustrate that the lock point varies based on the strobe signal which the strobe signal selector of FIG. 3 selects, respectively.

Referring to FIG. 16A, the control logic 270 of FIG. 3 determines, based on the detection signal, a skew from among a plurality of skews as a lock point LP11, at which the first voltage signal VOUT1 and the second voltage signal VOUT2 intersect each other and the detection signal DS has a positive slope, based on the selected strobe signal, and may determine a skew at the lock point LP11 as a target setup margin and a target hold margin.

Figure 16B:
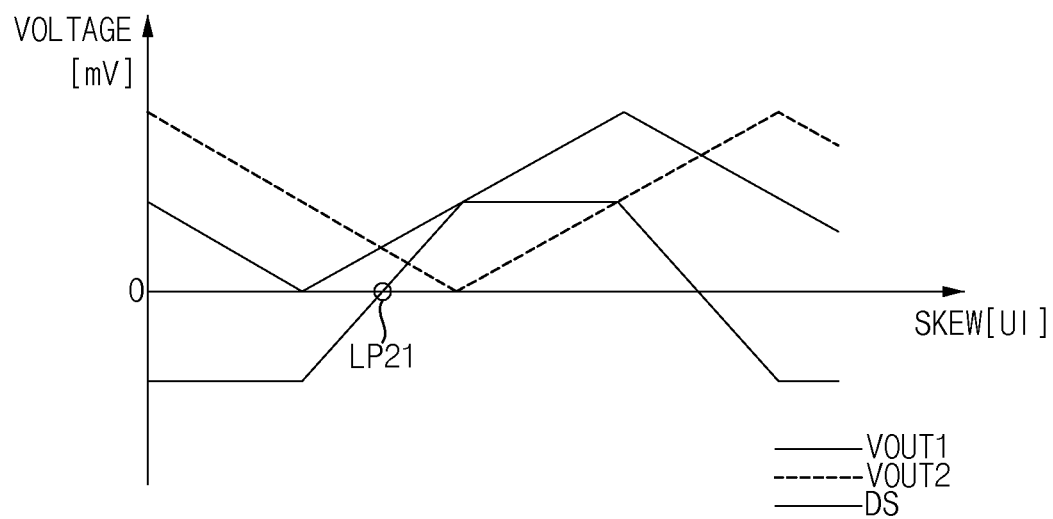

Referring to FIG. 16B, the control logic 270 of FIG. 3 determines, based on the detection signal, a skew from among a plurality of skews as a lock point LP21, at which the first voltage signal VOUT1 and the second voltage signal VOUT2 intersect each other and the detection signal DS has a positive slope, based on the selected strobe signal, and may determine a skew at the lock point LP21 as a target setup margin and a target hold margin.

Figure 16C:
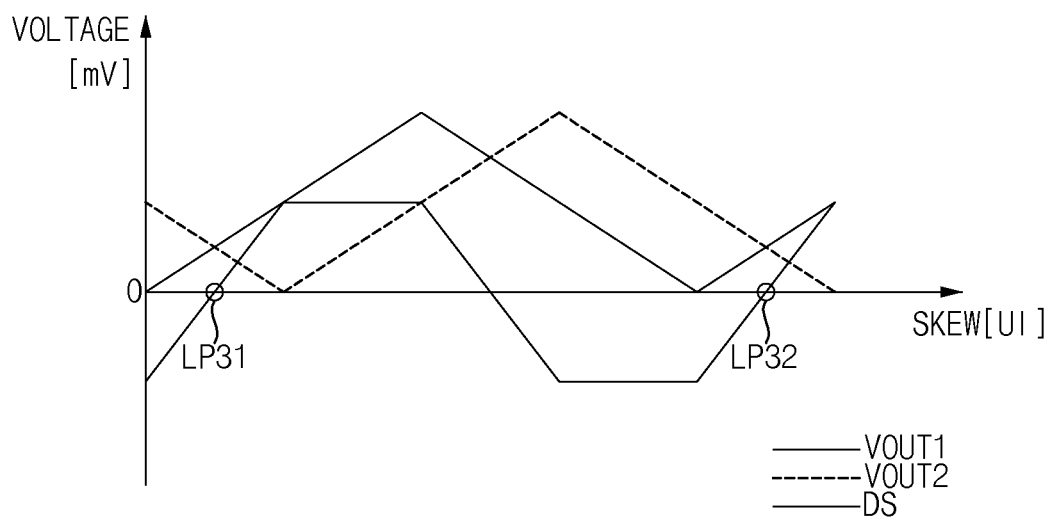

Referring to FIG. 16C, the control logic 270 of FIG. 3 determines, based on the detection signal, skews from among a plurality of skews as lock points LP31 and LP32 at which the first voltage signal VOUT1 and the second voltage signal VOUT2 intersect and the detection signal DS has a positive slope, based on the selected strobe signal, and may determine a skew at the lock point LP31 as a target setup margin and a target hold margin.

Figure 16D:
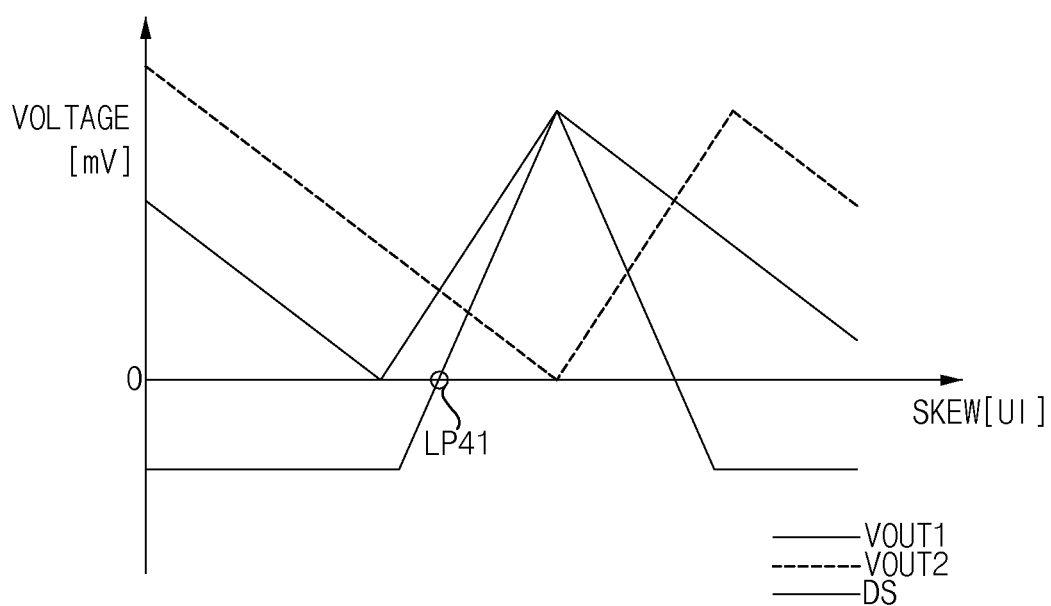

Referring to FIG. 16D, the control logic 270 of FIG. 3 determines, based on the detection signal, a skew from among a plurality of skews as a lock point LP41 at which the first voltage signal VOUT1 and the second voltage signal VOUT2 intersect each other and the detection signal DS has a positive slope, based on the selected strobe signal, and may determine a skew at the lock point LP41 as a target setup margin and a target hold margin.

Therefore, a transmitter for ultra-high speed according to an embodiment, may adjust skews between the test data and the multi-phase clock signal, wherein the test data is transmitted through a path separate from a path through which the data signal is transmitted, may determine a lock point associated with a target setup margin and a target hold margin based on the adjusted skew, and may transmit data based on the adjusted clock signals having the adjusted skew. Accordingly, the transmitter may transmit the data signal stably even with a high data transmission rate.

Figure 17:
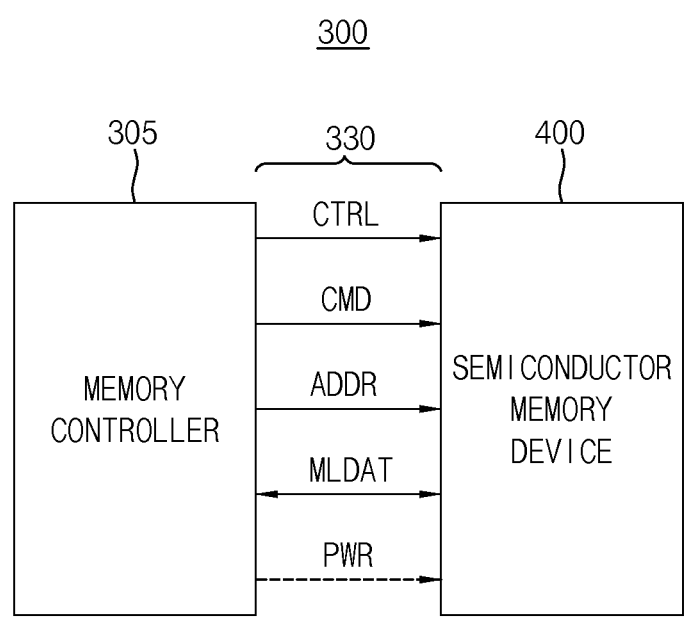
FIG. 17 is a block diagram illustrating a memory system according to an embodiment.

FIG. 17 illustrates a memory system according to an embodiment.

Referring to FIG. 17, a memory system 300 may include a memory controller 305 and a semiconductor memory device 400. The memory system 300 may further include a plurality of signal lines 330 that may electrically connect the memory controller 305 with the semiconductor memory device 400.

The semiconductor memory device 400 may be controlled by the memory controller 305. For example, based on requests from a host, the memory controller 305 may store (e.g., write or program) data into the semiconductor memory device 400, or may retrieve (e.g., read or sense) data from the semiconductor memory device 400.

The plurality of signal lines 330 may include control lines, command lines, address lines, data input/output (I/O) lines and power lines. The memory controller 305 may transmit a command CMD, an address ADDR and a control signal CTRL to the semiconductor memory device 400 via the command lines, the address lines and the control lines, may exchange a data signal MLDAT with the semiconductor memory device 400 via the data I/O lines, and may transmit a power supply voltage PWR to the semiconductor memory device 400 via the power lines.

For example, a data signal MLDAT may be a PAM-3 multi-level signal that is generated and transmitted according to an embodiment. In an embodiment, the plurality of signal lines 330 may further include data strobe (DQS) signal lines for transmitting a DQS signal.

In an embodiment, at least a part of the signal lines 330 may be referred to as a communications line, link or channel. The term "channel" as used herein may represent signal lines that include the data I/O lines for transmitting the data signal MLDAT. However, the present disclosure is not limited thereto, and the channel may further include the command lines for transmitting the command CMD and/or the address lines for transmitting the address ADDR.

Figure 18:
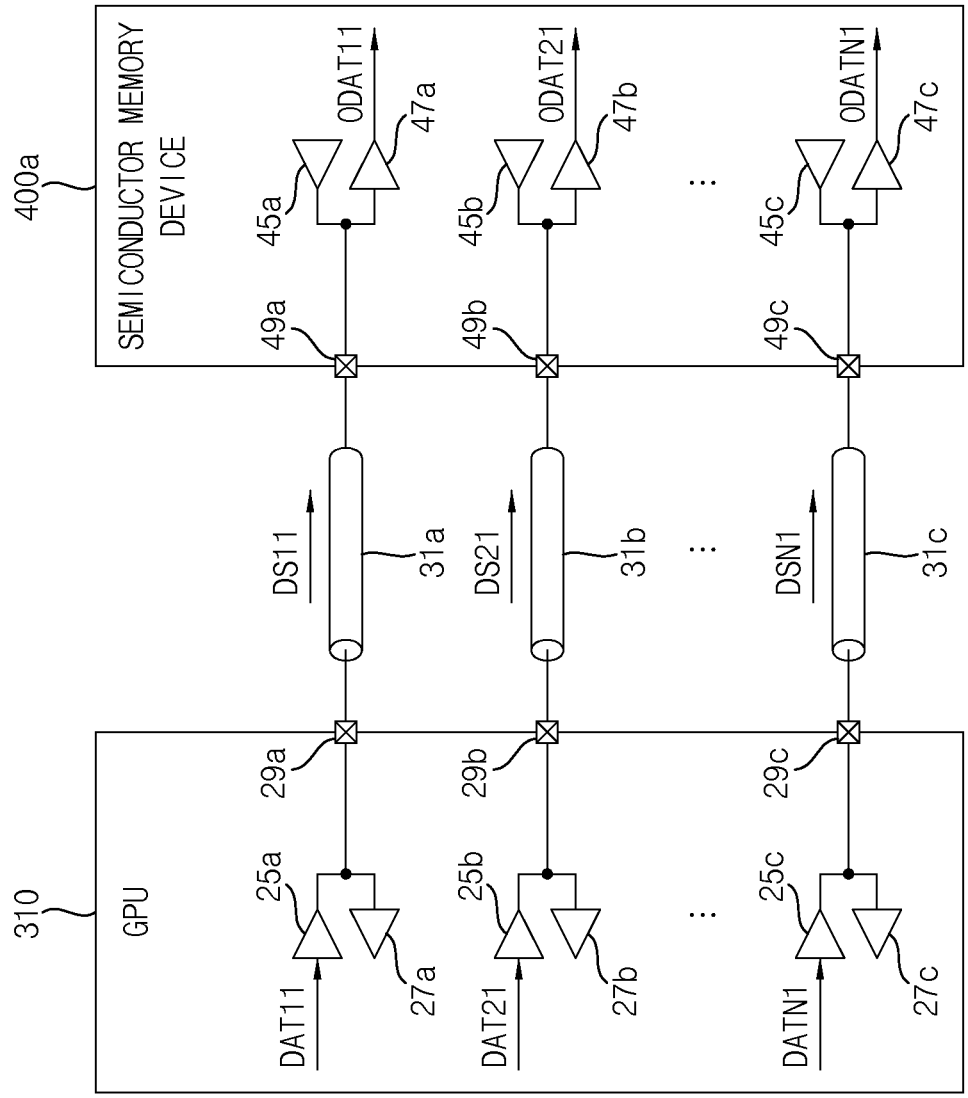
FIGS. 18 and 19 are block diagrams illustrating an example of a memory system of FIG. 17.
Figure 19:
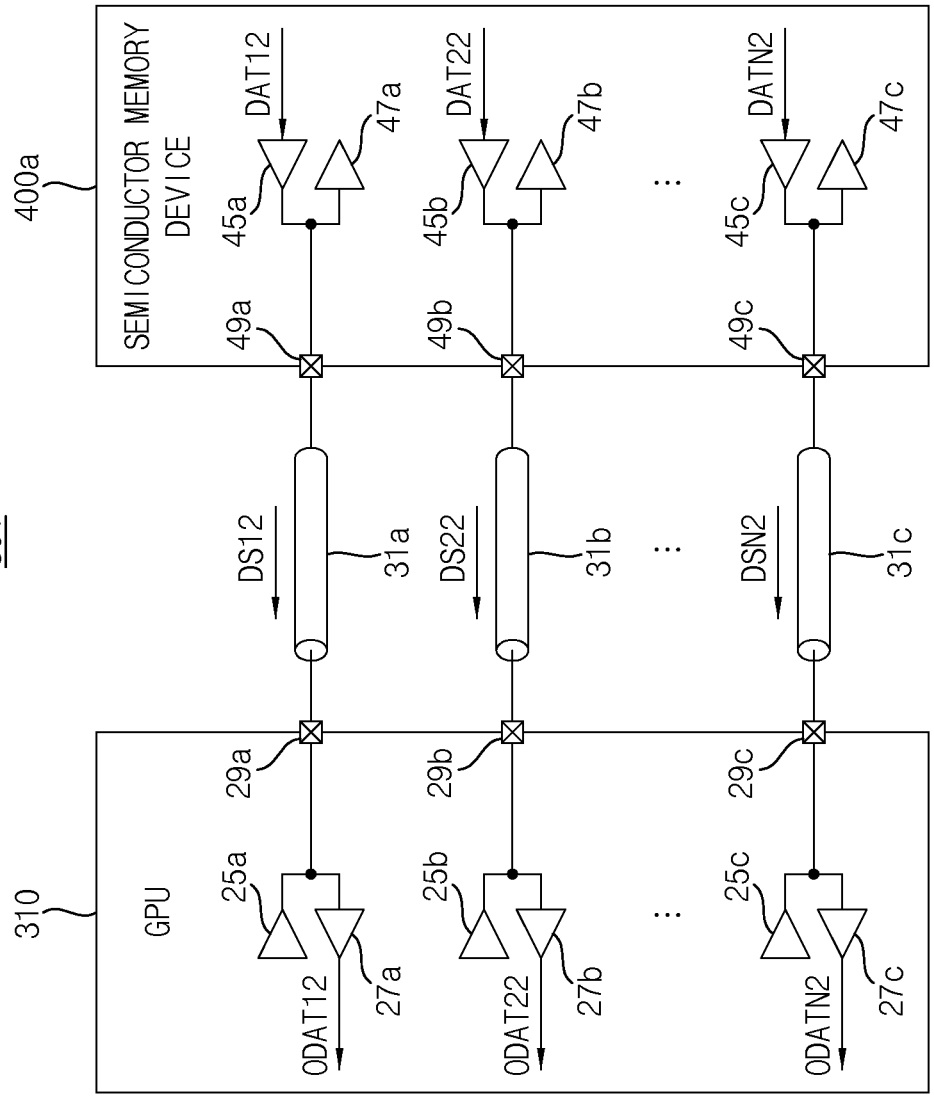

FIGS. 18 and 19 illustrate an example of a memory system of FIG. 17.

Referring to FIGS. 18 and 19, a memory system 301 may include a graphics processing unit (GPU) 310, a semiconductor memory device 400a and a plurality of channels 31a, 31b through 31c.

The GPU 310 may include a plurality of transmitters 25a, 25b through 25c, a plurality of receivers 27a, 27b through 27c, and a plurality of data I/O pads 29a, 29b through 29c. The semiconductor memory device 400a may include a plurality of transmitters 45a, 45b through 45c, a plurality of receivers 47a, 47b through 47c, and a plurality of data I/O pads 49a, 49b through 49c.

Each of the plurality of transmitters 25a, 25b through 25c, 45a, 45b through 45c may generate a PAM-3 multi-level signal, may perform the method of generating multi-level signal. Each of the plurality of receivers 27a, 27b through 27c, 47a, 47b through 47c may receive the PAM-3 multi-level signal. The plurality of transmitters 25a, 25b through 25c, 45a, 45b through 45c and the plurality of receivers 27a, 27b through 27c, 47a, 47b through 47c may transmit and receive PAM-3 multi-level signal through the plurality of channels 31a, 31b through 31c.

Each of the plurality of transmitters 25a, 25b through 25c, 45a, 45b through 45c may employ the transmitter 100 of FIG. 3.

Each of the plurality of data I/O pads 29a, 29b through 29c, 49a, 49b through 49c may be connected to a respective one of the plurality of transmitters 25a, 25b through 25c, 45a, 45b through 45c and a respective one of the plurality of receivers 27a, 27b through 27c, 47a, 47b through 47c.

The plurality of channels 31a, 31b through 31c may connect the GPU 310 with the semiconductor memory device 400a. Each of the plurality of channels 31a, 31b through 31c may be connected to a respective one of the plurality of transmitters 25a, 25b through 25c and a respective one of the plurality of receivers 27a, 27b through 27c through a respective one of the plurality of data I/O pads 29a, 29b through 29c. In addition, each of the plurality of channels 31a, 31b through 31c may be connected to a respective one of the plurality of transmitters 45a, 45b through 45c and a respective one of the plurality of receivers 47a, 47b through 47c via a respective one of the plurality of data I/O pads 49a, 49b through 49c. The PAM-3 multi-level signal may be transmitted through each of the plurality of channels 31a, 31b through 31c.

FIG. 18 illustrates an operation of transferring data from the GPU 310 to the semiconductor memory device 400a. For example, the transmitter 25a may generate an output data signal DS11, which may be a PAM-3 multi-level signal, based on input data DAT11, and the output data signal DS11 may be transmitted from the GPU 310 to the semiconductor memory device 400a through the channel 31a. The receiver 47a may receive the output data signal DS11 to obtain data ODAT11 corresponding to the input data DAT11.

Similarly, the transmitter 25b may generate an output data signal DS21, which may be a PAM-3 multi-level signal, based on input data DAT21, and the output data signal DS21 may be transmitted to the semiconductor memory device 400a through the channel 31b. The receiver 47b may receive the output data signal DS21 to obtain data ODAT21 corresponding to the input data DAT21. The transmitter 25c may generate an output data signal DSN1, which may be a PAM-3 multi-level signal, based on input data DATN1, and the output data signal DSN1 may be transmitted to the semiconductor memory device 400a through the channel 31c. The receiver 47c may receive the output data signal DSN1 to obtain data ODATN1 corresponding to the input data DATN1. For example, the input data DAT11, DAT21 and DATN1 may be write or program data to be written or programmed into the semiconductor memory device 400a.

FIG. 19 illustrates an operation of transferring data from the semiconductor memory device 400a to the GPU 310. For example, the transmitter 45a may generate an output data signal DS12, which may be a PAM-3 multi-level signal, based on input data DAT12, and the output data signal DS12 may be transmitted from the semiconductor memory device 400a to the GPU 310 through the channel 31a. The receiver 27a may receive the output data signal DS12 to obtain data ODAT12 corresponding to the input data DAT12.

Similarly, the transmitter 45b may generate an output data signal DS22, which may be a PAM-3 multi-level signal, based on input data DAT22, and the output data signal DS22 may be transmitted to the GPU 310 through the channel 31b. The receiver 27b may receive the output data signal DS22 to obtain data ODAT22 corresponding to the input data DAT22. The transmitter 45c may generate an output data signal DSN2, which may be a PAM-3 multi-level signal, based on input data DATN2, and the output data signal DSN2 may be transmitted to GPU 310 through the channel 31c. The receiver 27c may receive the output data signal DSN2 to obtain data ODATN2 corresponding to the input data DATN2. For example, the input data DAT12, DAT22 and DATN2 may be read or sense data retrieved from the semiconductor memory device 400a.

Figure 20:
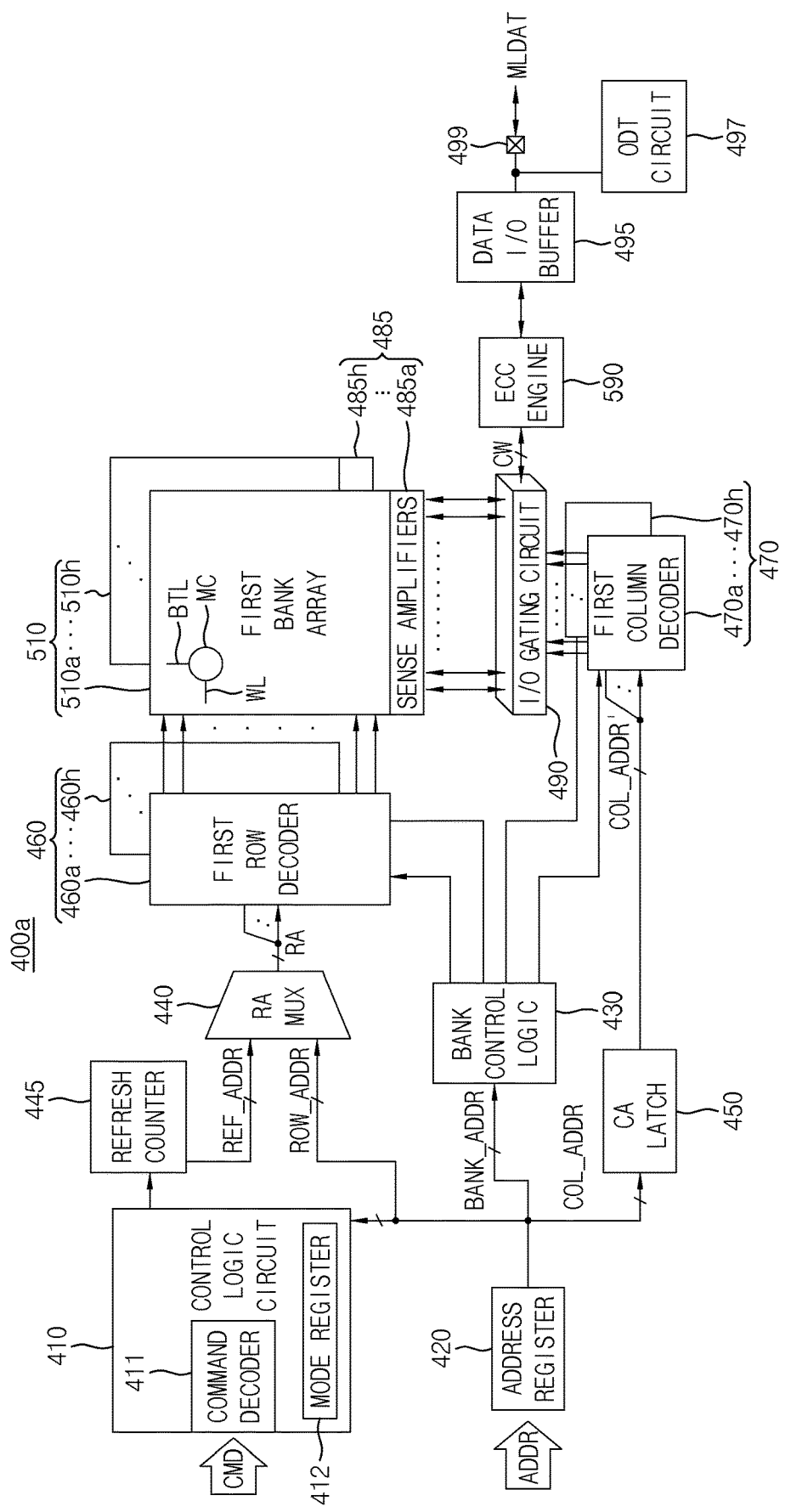
FIG. 20 is a block diagram illustrating an example of the semiconductor memory device included in the memory system of FIGS. 18 and 19 according to an embodiment.

FIG. 20 illustrates an example of the semiconductor memory device included in the memory system of FIGS. 18 and 19 according to an embodiment.

Referring to FIG. 20, the semiconductor memory device 400a may include control logic circuit 410, an address register 420, bank control logic 430, a row address multiplexer 440, a refresh counter 445, a column address latch 450, a row decoder 460, a column decoder 470, a memory cell array 510, a sense amplifier unit 485, an I/O gating circuit 490, an error correction code (ECC) engine 590, a data I/O buffer 495, and an on-die termination (ODT) circuit 497.

For example, the semiconductor memory device 400a may be a volatile memory device and may include a graphics double data rate 7 (GDDR7) synchronous dynamic random-access memory (SDRAM) device.

The memory cell array 510 includes first through eighth bank arrays 510a to 510h. The row decoder 460 includes first through eighth bank row decoders 460a to 460h respectively coupled to the first through eighth bank arrays 510a to 510h, the column decoder 470 includes first through eighth bank column decoders 470a to 470h respectively coupled to the first through eighth bank arrays 510a to 510h, and the sense amplifier unit 485 includes first through eighth bank sense amplifiers 485a to 485h respectively coupled to the first through eighth bank arrays 510a to 510h.

The first through eighth bank arrays 510a to 510h, the first through eighth bank row decoders 460a to 460h, the first through eighth bank column decoders 470a to 470h and the first through eighth bank sense amplifiers 485a to 485h may form first through eighth banks. Each of the first through eighth bank arrays 510a to 510h may include a plurality of memory cells MC formed at intersections of a plurality of word-lines WL and a plurality of bit-lines BTL.

The address register 420 may receive the address ADDR including a bank address BANK_ADDR, a row address ROW_ADDR and a column address COL_ADDR from a memory controller in the GPU 310. The address register 420 may provide the received bank address BANK_ADDR to the bank control logic 430, the received row address ROW_ADDR to the row address multiplexer 440, and the received column address COL_ADDR to the column address latch 450.

The bank control logic 430 may generate bank control signals in response to the bank address BANK_ADDR. One of the first through eighth bank row decoders 510a to 510h corresponding to the bank address BANK_ADDR may be activated in response to the bank control signals, and one of the first through eighth bank column decoders 470a to 470h corresponding to the bank address BANK_ADDR may be activated in response to the bank control signals.

The row address multiplexer 440 may receive the row address ROW_ADDR from the address register 420, and may receive a refresh row address REF_ADDR from the refresh counter 445. The row address multiplexer 440 may selectively output the row address ROW_ADDR or the refresh row address REF_ADDR as a row address RA. The row address RA that is output from the row address multiplexer 440 may be applied to the first through eighth bank row decoders 460a to 460h.

The refresh counter 445 may sequentially increase or decrease the refresh row address REF_ADDR and may output the refresh row address REF_ADDR under control of the control logic circuit 410.

The activated one of the first through eighth bank row decoders 460a to 460h, as activated by the bank control logic 430, may decode the row address RA that is output from the row address multiplexer 440, and may activate a word-line corresponding to the row address RA. For example, the activated bank row decoder may apply a word-line driving voltage to the word-line corresponding to the row address.

The column address latch 450 may receive the column address COL_ADDR from the address register 420, and may temporarily store the received column address COL_ADDR. In an embodiment, in a burst mode, the column address latch 450 generates column addresses COL_ADDR' that increment from the received column address COL_ADDR. The column address latch 450 may apply a temporarily stored column address COL_ADDR or generated column address COL_ADDR' to the first through eighth bank column decoders 470a to 470h.

The activated one of the first through eighth bank column decoders 470a to 470h may activate a sense amplifier corresponding to the bank address BANK_ADDR and the column address COL_ADDR through the I/O gating circuit 490.

The I/O gating circuit 490 may include circuitry for gating input/output data, and may further include input data mask logic, read data latches for storing data that is output from the first through eighth bank arrays 510a to 510h, and write drivers for writing data to the first through eighth bank arrays 510a to 510h.

A codeword CW read from one bank array of the first through eighth bank arrays 510a to 510h may be sensed by a sense amplifier coupled to the one bank array from which the data is to be read, and may be stored in the read data latches. The codeword CW stored in the read data latches may be provided to the memory controller via the data I/O buffer 495 after ECC decoding is performed on the codeword CW by the ECC engine 590.

The multi-level data MLDAT to be written in one bank array of the first through eighth bank arrays 510a to 510h may be provided to the data I/O buffer 495 from the memory controller, and may be provided to the ECC engine 590 from the data I/O buffer 495. The ECC engine 590 may perform an ECC encoding on multi-level data MLDAT to generate parity bits, the ECC engine 590 may provide the multi-level data MLDAT and the parity bits to the I/O gating circuit 490, and the I/O gating circuit 490 may write the multi-level data MLDAT and the parity bits in a sub-page in one bank array through the write drivers.

The data I/O buffer 495 may provide the multi-level data MLDAT to the ECC engine 590 in a write operation of the semiconductor memory device 400a, and may provide the multi-level data MLDAT from the ECC engine 490 to the memory controller in a read operation of the semiconductor memory device 400a.

The ECC engine 590 may perform an ECC encoding and an ECC decoding on the multi-level data MLDAT under control of the control logic circuit 410.

The control logic circuit 410 may control operations of the semiconductor memory device 400a. For example, the control logic circuit 410 may generate control signals for the semiconductor memory device 400a in order to perform a write operation or a read operation. The control logic circuit 410 may include a command decoder 411 that decodes the command CMD received from the memory controller and a mode register 412 that sets an operation mode of the semiconductor memory device 400a.

For example, the command decoder 411 may generate the control signals corresponding to the command CMD by decoding a write enable signal, a row address strobe signal, a column address strobe signal, a chip select signal, or the like.

The ODT circuit 497 may be connected to a data I/O pad 499 and the data I/O buffer 495. When the ODT circuit 497 is enabled, the ODT circuit 497 may perform an ODT operation. When the ODT operation is performed, signal integrity of a transmitted and/or received signal may be enhanced by preventing signal reflection due to impedance matching.

Figure 21:
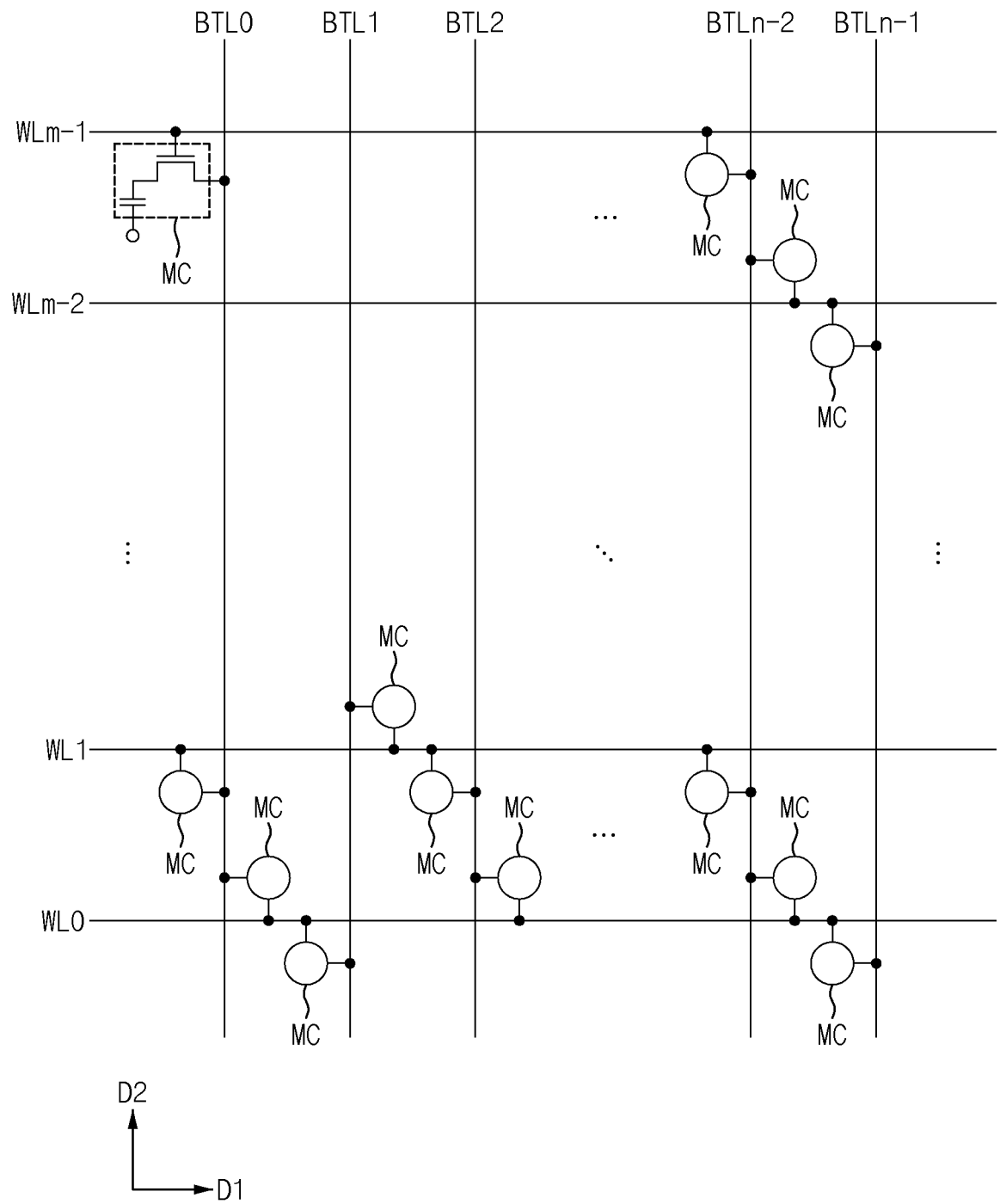
FIG. 21 is a circuit diagram that illustrates an example of the first bank array in the semiconductor memory device of FIG. 20.

FIG. 21 illustrates an example of the first bank array in the semiconductor memory device of FIG. 20.

Referring to FIG. 21, the first bank array 510a may include a plurality of word-lines WL0 to WLm−1, where m may be an even number greater than or equal to two, a plurality of bit-lines BTL0 to BTLn−1, where n may be an even number greater than or equal to two, and a plurality of memory cells MCs disposed at intersections between the word-lines WL0 to WLm−1 and the bit-lines BTL0 to BTLn−1.

The word-lines WL to WLm−1 may extend in a first direction D1 and the bit-lines BTL0 to BTLn−1 may extend in a second direction D2 crossing the first direction D1.

Each of the memory cells MCs includes an access or access cell transistor coupled to one of the word-lines WL0 to WLm−1 and one of the bit-lines BTL0 to BTLn−1 and a storage or storage cell capacitor coupled to the cell transistor. That is, each of the memory cells MCs may have a dynamic random-access memory (DRAM) cell structure. In addition, the memory cells MCs may have different arrangements depending on whether the memory cells MCs are coupled to an even word-line (for example, WL0) or an odd word-line (for example, WL1). That is, a bit-line coupled to adjacent memory cells may be different depending on whether a word-line selected by an access address is an even word-line or an odd word-line. However, the present disclosure is not limited thereto. In an embodiment, the memory cells MCs coupled to the even word-line (for example, WL0) and the odd word-line (for example, WL1) may have the same arrangement.

Figure 22:
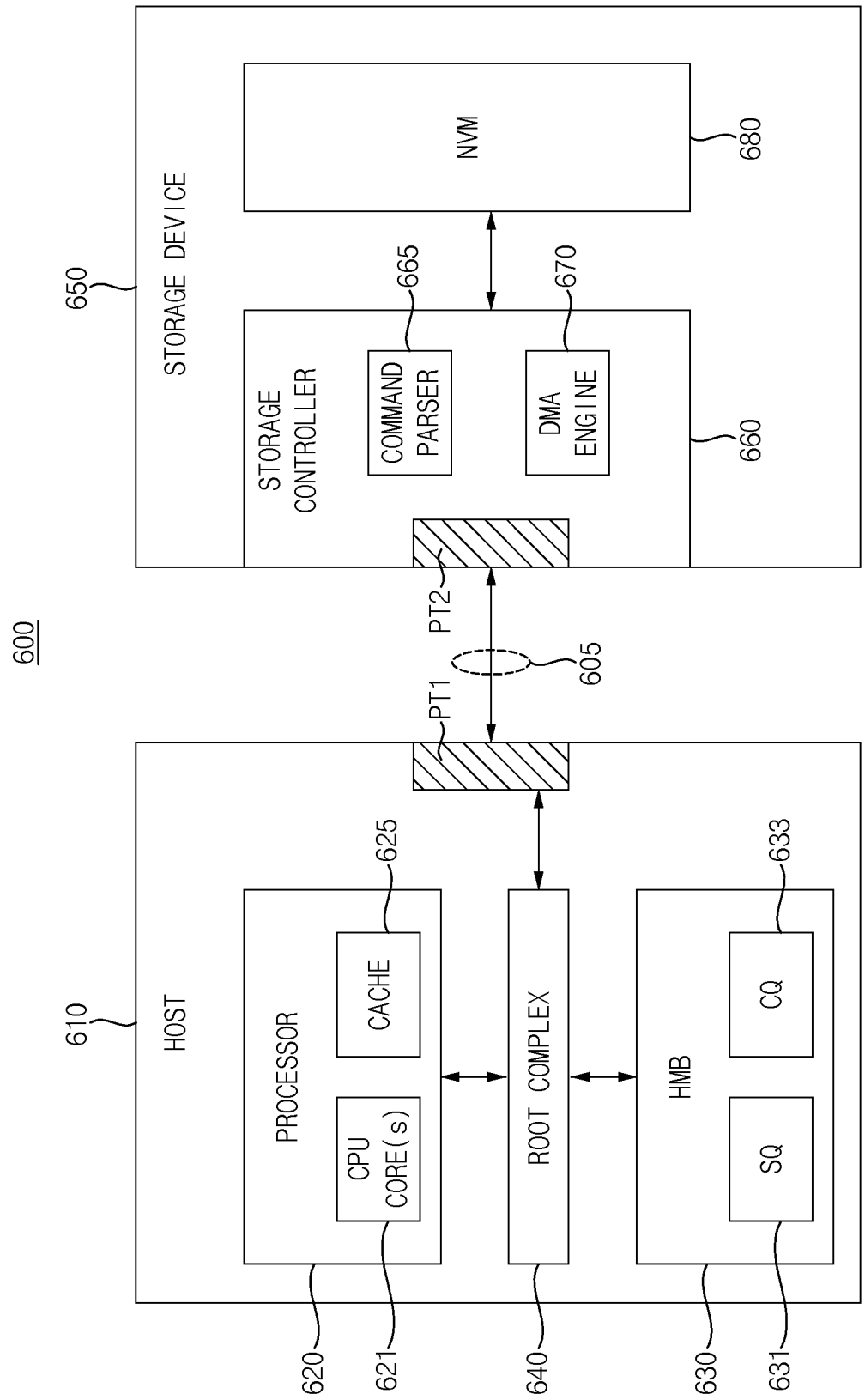
FIG. 22 is a block diagram illustrating a storage system according to an embodiment.

FIG. 22 illustrates a storage system according to an embodiment.

Referring to FIG. 22, a storage system 600 may include a host 610 and a storage device 650 connected to each other through a line, link or channel 605. Although FIG. 22 illustrates only the elements for describing an embodiment adapted for ease of explanation by example, each of the host 610 and the storage device 650 may further include various other elements depending on their desired functionalities and design criteria.

The host 610 may control overall operations of the storage system 600. For example, the host 610 may store data in the storage device 650 or may read data stored in the storage device 650. The host 610 may communicate with the storage device 650 through a first port PT1. In an embodiment, the first port PT1 may be a physical port that is based on a PCIe protocol. However, the present disclosure is not limited thereto.

Hereinafter, for ease of describing the technical features of the present disclosure more precisely, it may be assumed that the host 610 and the storage device 650 communicate with each other through a PCIe protocol-based physical port such as the first port PT1 and the second port PT2, without limitation thereto.

The host 610 may include a processor 620, a host memory buffer (HMB) 630 and a root complex 640.

The processor 620 may be referred to as a host processor and may include at least one CPU core 621 and a cache 625 dedicated to the CPU core 621.

The HMB 630 may include a submission queue SQ 631 and a completion queue CQ 633. The submission queue 631 may be storage such as dedicated storage that stores a command to be provided to the storage device 650. The completion queue 633 may be storage such as dedicated storage that stores completion information regarding an operation completed in the storage device 650 based on the command.

The root complex 640 may be connected to the processor 620 and the HMB 630.

The storage device 650 may include a storage controller 660 and at least one nonvolatile memory (NVM) device 680.

The at least one nonvolatile memory device 680 may operate under control of the storage controller 660. The at least one nonvolatile memory device 680 may be or include a NAND flash memory device, however, the present disclosure is not limited thereto. For example, the at least one nonvolatile memory device 680 may be or include a NOR flash memory device.

The storage controller 660 may include a command parser 665 and a direct memory access (DMA) engine 670.

The command parser 665 may parse the command from the host 610 and may provide the parsed command to the nonvolatile memory device 680, and the DMA engine 670 may control a direct memory access on the nonvolatile memory device 680 or the HMB 630.

In an embodiment, the host 610 and the storage device 650 may be connected to each other through a PCIe link 605 according to PCIe standards, without limitation thereto.

Figure 23:
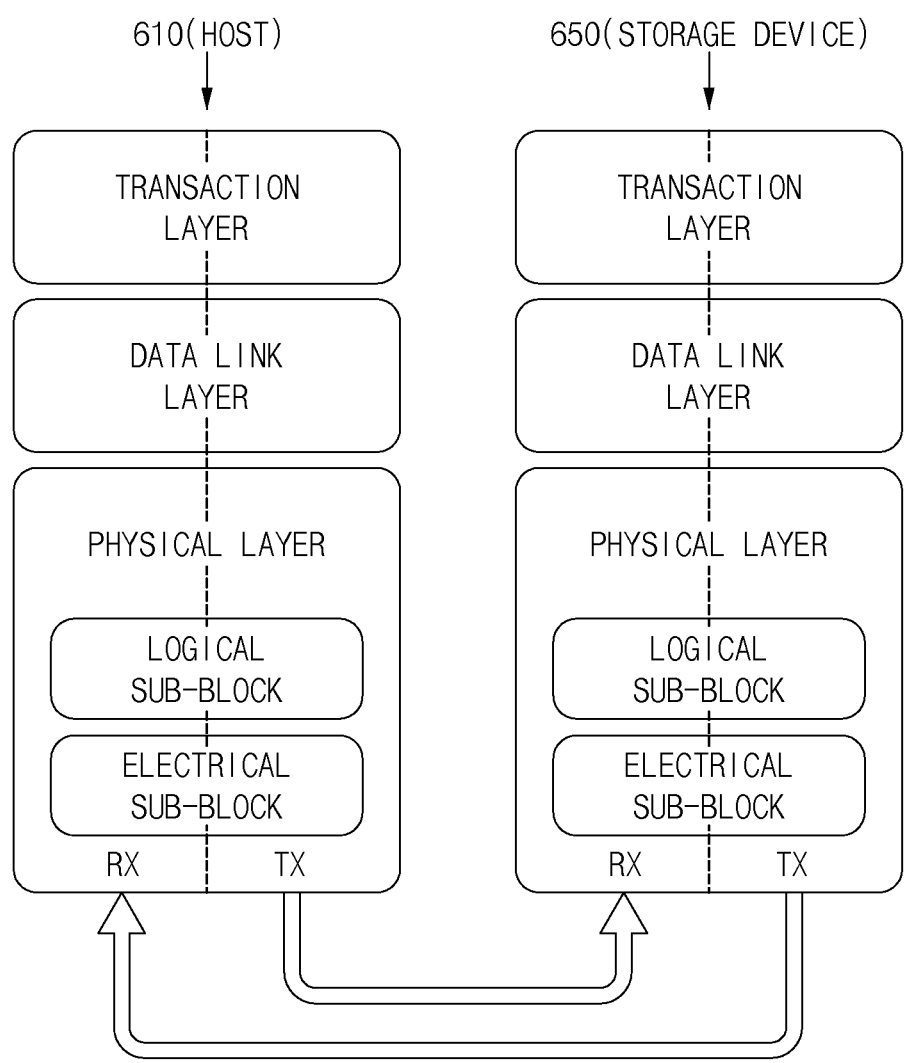
FIGS. 23 and 24 are conceptual communications layer diagrams illustrating an example of an interconnect architecture applied to a system according to an embodiment.
Figure 24:
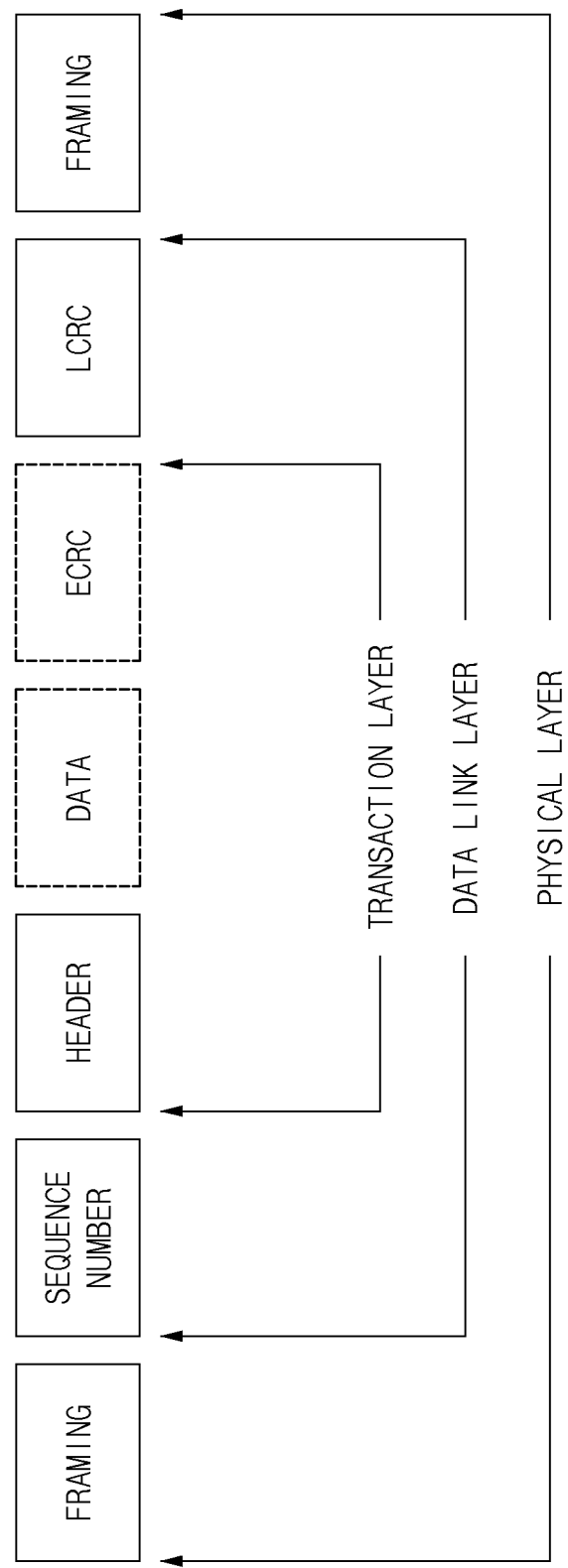

FIGS. 23 and 24 illustrate an example of an interconnect architecture applied to a system according to an embodiment.

Referring to FIGS. 23 and 24, an embodiment of a layered protocol stack is illustrated. A layered protocol stack includes any form of a layered communications stack, such as a Quick Path Interconnect (QPI) stack, a PCIe stack, a next generation high performance computing interconnect stack, or other layered stack or the like. Although an embodiment is described in relation to a PCIe stack, the same concepts may be applied to other interconnect stacks, without limitation thereto. In an embodiment, the protocol stack is a PCIe protocol stack including a transaction layer, a data link layer, and a physical layer. An interface may be represented as a communications protocol stack. Representation as a communications protocol stack may also be referred to as a module or interface implementing and/or including a protocol stack.

The PCI Express (PCIe) stack uses packets to communicate information between components. The packets are formed in the transaction layer and the data Link Layer to carry the information from the transmitting component to the receiving component. As the transmitted packets flow through the other layers, they may be extended with additional information used to handle packets at those layers. At the receiving side the reverse process occurs and packets get transformed from their physical layer representation to the data link layer representation and, for transaction layer packets, to the form that may be processed by the transaction layer of the receiving device.

In an embodiment, the transaction layer provides an interface between a device's processing core and the interconnect architecture, such as the data link layer and the physical layer. In this regard, a primary responsibility of the transaction layer may be the assembly and disassembly of packets (e.g., the transaction layer packets, or TLPs). The translation layer may manage credit-based flow control for TLPs. The PCIe stack implements split transactions, such as transactions with a request and a response separated by time, allowing a link to carry other traffic while the target device gathers data for the response.

In addition, the PCIe stack utilizes credit-based flow control. In this scheme, a device advertises an initial amount of credit for each of the receive buffers in the transaction layer. An external device at the opposite end of the link, such as the controller hub 515 of FIG. 5, counts the number of credits consumed by each TLP. A transaction may be transmitted if the transaction does not exceed a credit limit. Upon receiving a response, an amount of credit is restored. Such a credit scheme may prevent the latency of credit return from affecting performance, provided that the credit limit is not reached.

In an embodiment, the transaction layer assembles packet header and/or payload information. The payload information may include data and an error detection code, such as but not limited to an end-point cyclic redundancy check (ECRC). Format for current packet headers and/or payloads may be found in the PCIe specification at the PCIe specification website, https://pcisig.com/specifications/.

The link layer, also referred to as the data link layer, acts as an intermediate stage between the transaction layer and the physical layer or the PHY layer. In an embodiment, the data link layer is responsible for providing a reliable mechanism for exchanging the transaction layer packets (TLPs) between two components, such as between the host 610 and the storage device 650, through a line, link or channel. One side of the data link layer accepts TLPs assembled by the transaction layer; applies a packet sequence identifier such as a sequence number, an identification number or a packet number; calculates and applies an error detection code such as a link cyclic redundancy check (LCRC); and submits the modified TLPs to the physical layer for transmission across a physical line, link or channel to an external device.

In an embodiment, the physical layer includes a logical sub-block and an electrical sub-block to physically transmit a packet to an external device. Here, the logical sub-block is responsible for the "digital" functions of the physical layer. In this regard, the logical sub-block includes a transmitter section to prepare outgoing information for transmission by the physical sub-block, and a receiver section to identify and prepare received information before passing it to the link layer.

The physical block includes a transmitter TX and a receiver RX. The transmitter TX may employ the transmitter 100 of FIG. 3. The transmitter TX is supplied with symbols by the logical sub-block, which the transmitter serializes and transmits to an external device. The receiver RX is supplied with serialized symbols from an external device, and transforms the received serialized symbol signals into a bit-stream. The bit-stream is de-serialized and supplied to the logical sub-block. In an embodiment, an eight-bit (8b) and/or ten-bit (10b) transmission code is employed, where eight-bit and/or ten-bit symbols may be transmitted and/or received. Here, special symbols may be used to frame a packet with frames. In addition, in one example, the receiver RX also provides a symbol clock recovered from the incoming serial stream.

As stated above, although the transaction layer, the link layer, and physical layer are discussed with reference to a specific embodiment of a PCIe protocol stack, a layered protocol stack is not so limited. In fact, any layered protocol may be included and/or implemented.

For example, the PCIe interface technology has been developed in the order of first generation (GEN1), second generation (GEN2), third generation (GEN3), fourth generation (GEN4), fifth generation (GEN5), and sixth generation (GENE).

The first generation supports a raw data rate of 2.5 giga-transfers per second (GT/s), the second generation supports a raw data rate of 5 GT/s, the third generation supports a raw data rate of 8 GT/s, the fourth generation supports a raw data rate of 16 GT/s, the fifth generation supports a raw data rate of 32 GT/s, and the sixth generation supports a raw data rate of 64 GT/s.

A seventh generation PCIe interface may eventually support a raw data rate of 128 GT/s, and thus, jitter of the data signal may become very sensitive to a process, a voltage and a temperature. Because the transmitter TX employs the transmitter 100 of FIG. 3, the transmitter TX may adjust skews between the test data and the multi-phase clock signal, wherein the test data is transmitted through a path separate from a path through which the data signal is transmitted, may determine a lock point associated with a target setup margin and a target hold margin based on the adjusted skew and may transmit data based on the adjusted clock signals having the adjusted skew. Accordingly, the transmitter TX may transmit the data signal stably even with a high data transmission rate.

Figure 25:
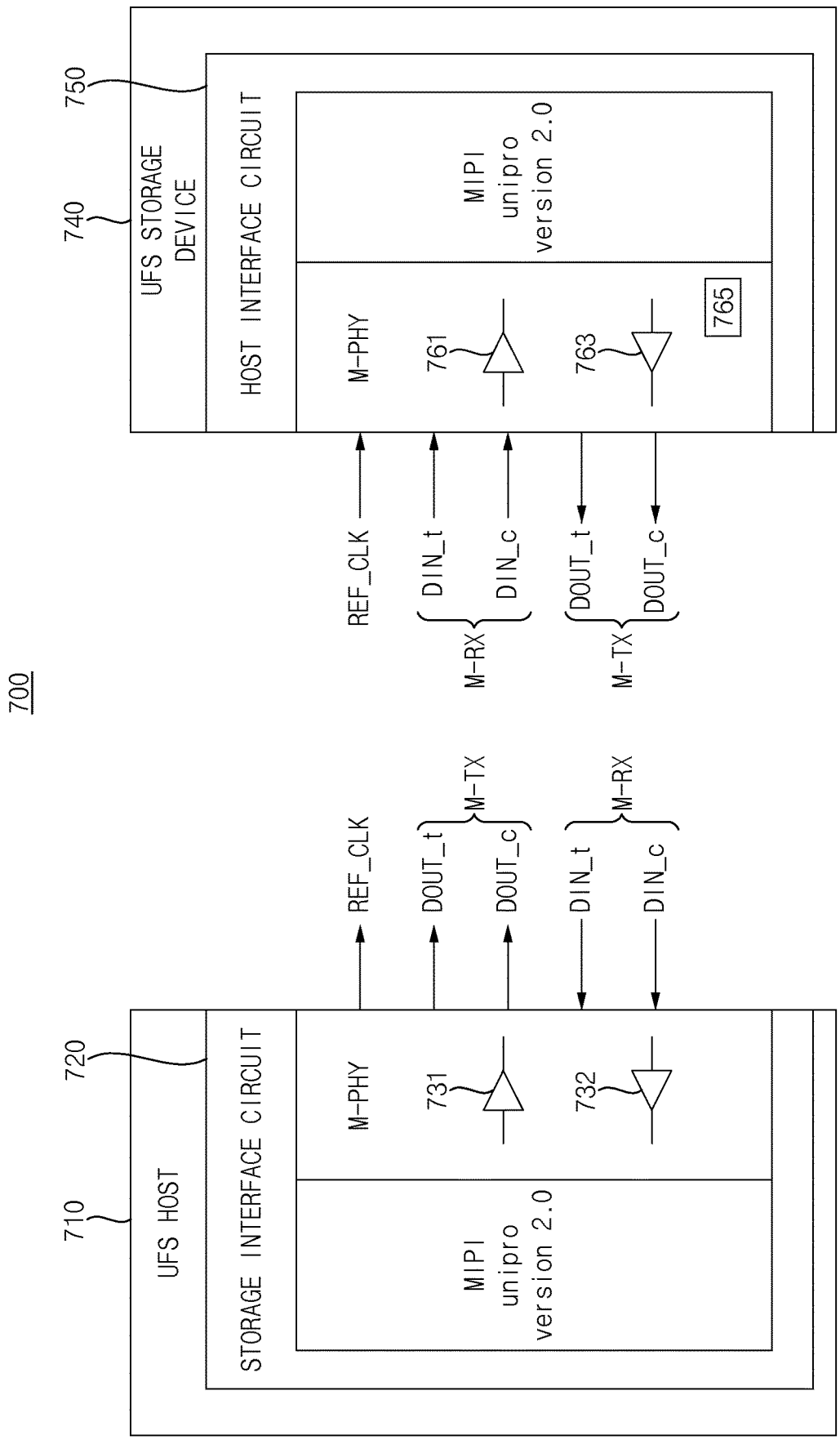
FIG. 25 is a block diagram illustrating a storage system according to an embodiment.

FIG. 25 illustrates a storage system according to an embodiment.

Referring to FIG. 25, a storage system 700 may include a universal flash storage (UFS) host 710 and a UFS storage device 740.

The UFS host 710 may include a storage interface circuit 720 and the UFS storage device 740 may include a host interface circuit 750. The storage interface circuit 720 may include a transmitter 731 and a receiver 732, and the host interface circuit 750 may include a receiver 761 and a transmitter 763

The storage interface circuit 720 and the host interface circuit 750 may be referred to as a first interface circuit and a second interface circuit, respectively, and may include a physical layer M-PHY and a Mobile Industry Processor Interface (MIPI) Alliance UniPro version 2.0 or the like corresponding to interface protocols suggested by the MIPI Alliance, without limitation thereto. The physical layer M-PHY of the UFS host or first interface circuit 720 may include a pair of lines for transmitting a differential output signal pair DOUT_t and DOUT_c, a pair of lines for receiving a differential input signal pair DIN_t and DIN_c, and a line for transmitting a reference clock signal REF_CLK.

The physical layer M-PHY of the first interface circuit 720 may transfer signals to the second interface circuit 750 through the output terminals DOUT_t and DOUT_c. The output terminals DOUT_t and DOUT_c may be connected to the transmitter 731 and may constitute a transmit channel M-TX of the first interface circuit 720. For example, the signals that are transferred through the output terminals DOUT_t and DOUT_c may be a pair of differential signals. That is, a signal that is transferred through the output terminal DOUT_c may be complementary to a signal that is transferred through the output terminal DOUT_t.

The physical layer M-PHY of the first interface circuit 720 may receive signals from the UFS storage device or second interface circuit 750 through the input terminals DIN_t and DIN_c. The input terminals DIN_t and DIN_c may be connected to the receiver 732 and may constitute a receive channel M-RX of the first interface circuit 720. For example, the signals that are received through the input terminals DIN_t and DIN_c may be a pair of differential signals. That is, a signal that is received through the input terminal DIN_c may be complementary to a signal that is received through the input terminal DIN_t.

The output terminals DOUT_t and DOUT_c and the input terminals DIN_t and DIN_c may be controlled to one of various states in compliance with a given protocol. For example, each of the output terminals DOUT_t and DOUT_c and the input terminals DIN_t and DIN_c may be controlled to a positive state, a negative state, a ground state, or a floating state DIF-Q.

When a level such as a voltage level of an output signal from the first output terminal DOUT_t is higher than a level of an output signal from the second output terminal DOUT_c, the output terminals DOUT_t and DOUT_c may be at the positive state. When the level of the output signal from the first output terminal DOUT_t is lower than the level of the output signal from the second output terminal DOUT_c, the output terminals DOUT_t and DOUT_c may be at the negative state. When the levels of the first output terminal DOUT_t and the second output terminal DOUT_c are floated, the output terminals DOUT_t and DOUT_c may be at the floating state DIF-Q. When the levels of the first output terminal DOUT_t and the second output terminal DOUT_c are substantially equal, the output terminals DOUT_t and DOUT_c may be at the ground state.

When a level of an input signal to the first input terminal DIN_t is higher than a level of an input signal to the second input terminal DIN_c, the input terminals DIN_t and DIN_c may be at the positive state. When the level of the input signal to the first input terminal DIN_t is lower than the level of the input signal to the second input terminal DIN_c, the input terminals DIN_t and DIN_c may be at the negative state. When the levels of the first input terminal DIN_t and the second input terminal DIN_c are substantially equal, the input terminals DIN_t and DIN_c may be at the ground state. When the levels of the first input terminal DIN_t and the second input terminal DIN_c are floated, the input terminals DIN_t and DIN_c may be at the floating state DIF-Q.

The second interface circuit 750 may include input terminals DIN_t and DIN_c, output terminals DOUT_t and DOUT_c and a clock terminal REF_CLK.

The output terminals DOUT_t and DOUT_c of the second interface circuit 750 may correspond to the input terminals DIN_t and DIN_c of the first interface circuit 720, and the input terminals DIN_t and DIN_c of the second interface circuit 750 may correspond to the output terminals DOUT_t and DOUT_c of the first interface circuit 720.

A physical layer M-PHY of the second interface circuit 750 may receive signals through the input terminals DIN_t and DIN_c and may transfer signals through the output terminals DOUT_t and DOUT_c. As in the above description given with reference to the first interface circuit 720, the output terminals DOUT_t and DOUT_c and the input terminals DIN_t and DIN_c of the second interface circuit 750 may be controlled to the positive state, the negative state, the ground state, or the floating state. Substantially duplicate description may be omitted.

According to the MIPI M-PHY specification, the physical layer M-PHY of the second interface circuit may include a reference clock detector 765. The reference clock detector 765 may detect a change between an idle mode and an active mode of the UFS storage device 740.

When the UFS storage device 740 does not execute any operation, the UFS storage device 740 may be in a first idle mode or a second idle mode. When the UFS storage device 740 is in the first idle mode or the second idle mode, the first interface circuit 720 need not transfer the reference clock REF_CLK to the second interface circuit 750. When the UFS storage device 740 switches from the first idle mode and/or the second idle mode to the active mode, the input terminals DIN_t and DIN_c of the second interface circuit 750 may switch from the floating state to the negative state. When the UFS storage device 740 switches from the first idle mode and/or the second idle mode to the active mode, the first interface circuit 720 may resume a transfer of the reference clock REF_CLK to the second interface circuit 750.

In an embodiment, when the UFS storage device 740 is in the second idle mode, the reference clock detector 765 may generate a trigger signal for allowing the UFS storage device 740 to enter the active mode, based on a toggling of the reference clock REF_CLK.

Each of the transmitters 731 and 763 may employ a transmitter 100 of FIG. 3 or the like.

In a MIPI Alliance generation 6 M-PHY, the data rate increased above all previous generations, and thus, jitter of the data signal become very sensitive to a process, a voltage and a temperature. Because each of the transmitters 731 and 763 employs the transmitter 100 of FIG. 3, each of the transmitters 731 and 763 may adjust skews between the test data and the multi-phase clock signal, wherein the test data is transmitted through a path separate from a path through which the data signal is transmitted, may determine a lock point associated with a target setup margin and a target hold margin based on the adjusted skew, and may transmit data based on the adjusted clock signals having the adjusted skew. Accordingly, each of the transmitters 731 and 763 may transmit the data signal stably even with a high data transmission rate.

Figure 26:
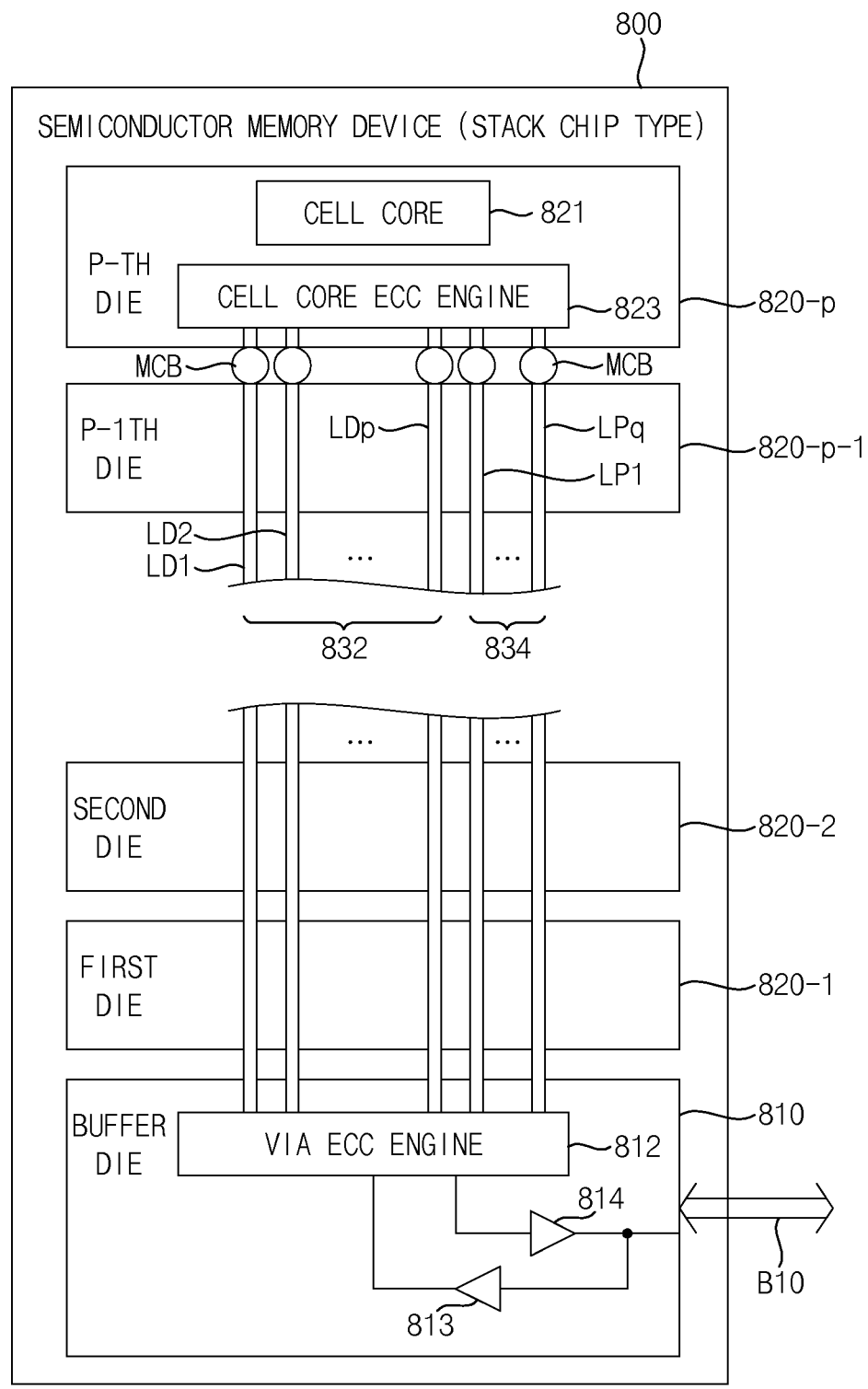
FIG. 26 is a block diagram illustrating a semiconductor memory device according to an embodiment.

FIG. 26 illustrates a semiconductor memory device according to an embodiment.

Referring to FIG. 26, a semiconductor memory device 800 may include at least one buffer die 810 and a plurality of memory dies 820-1 to 820-$p$, where p is a natural number greater than or equal to three, providing a soft error analyzing and correcting function in a stacked chip structure.

The plurality of memory dies 820-1 to 820-$p$ may be stacked on the buffer die 810. The memory dies may convey data through a plurality of through silicon via (TSV) lines.

Each of the memory dies 820-1 to 820-$p$ may include a cell core 821 to store data, and a cell core ECC engine 823 which generates transmission parity bits (e.g., transmission parity data) based on transmission data to be sent to the at least one buffer die 810. The cell core 821 may include a plurality of memory cells having a DRAM cell structure, without limitation thereto.

The at least one buffer die 810 may include a via ECC engine 812 which may correct a transmission error using the transmission parity bits when a transmission error is detected from the transmission data received through the TSV liens, and may generate error-corrected data.

The at least one buffer die 810 may further include a receiver 813 and a transmitter 814. The transmitter 814 may employ the transmitter 100 of FIG. 3. Therefore, the transmitter 814 may generate test data in parallel with a data signal provided from the via ECC engine 812, may adjust a skew or delay amount of the data signal based on the test data and may transmit, to an external memory controller, an output data signal having a target setup margin and a target hold margin.

The semiconductor memory device 800 may be a stack chip type memory device or a stacked memory device which conveys data and control signals through the TSV lines. The TSV lines may also be called 'through electrodes'.

Each respective cell core ECC engine 823 may perform error correction on data which is output from each respective memory die 820-1 to 820-$p$ before the transmission data is sent.

A transmission error which occurs at the transmission data may be due to noise which occurs at the TSV lines. Since a data failure due to the noise occurring at the TSV lines may be distinguishable from a data failure due to a false operation of the memory die, it may be regarded as soft data failure or a soft error. The soft data failure or soft error may be generated due to a transmission failure on a transmission path, and may be detected and remedied by an ECC operation.

In this embodiment, a data TSV line group 832 which is formed at one memory die 820-$p$ may include TSV lines LD1 and LD2 to LDp, and a parity TSV line group 834 may include TSV lines LP1 to LPq. The TSV lines LD1 and LD2 to LDp of the data TSV line group 832 and the parity TSV lines LP1 to LPq of the parity TSV line group 834 may be connected to micro bumps MCB which are correspondingly formed among the memory dies 820-1 to 820-$p$.

The semiconductor memory device 800 may have a three-dimensional (3D) chip structure or a 2.5D chip structure to communicate with the external memory controller through a data bus B10. The at least one buffer die 810 may be connected with the external memory controller through the data bus B10.

The cell core ECC engine 823 may output transmission parity bits as well as transmission data through the parity TSV line group 834 and the data TSV line group 832, respectively. The output transmission data may be data which is error-corrected by the cell core ECC engine 823. The via ECC engine 812 may determine whether a transmission error occurs in the transmission data received through the data TSV line group 832, based on the transmission parity bits received through the parity TSV line group 834. When a transmission error is detected, the via ECC engine 812 may correct the transmission error on the transmission data using the transmission parity bits. When the transmission error is uncorrectable, the via ECC engine 812 may output information indicating occurrence of an uncorrectable data error.

Figure 27:
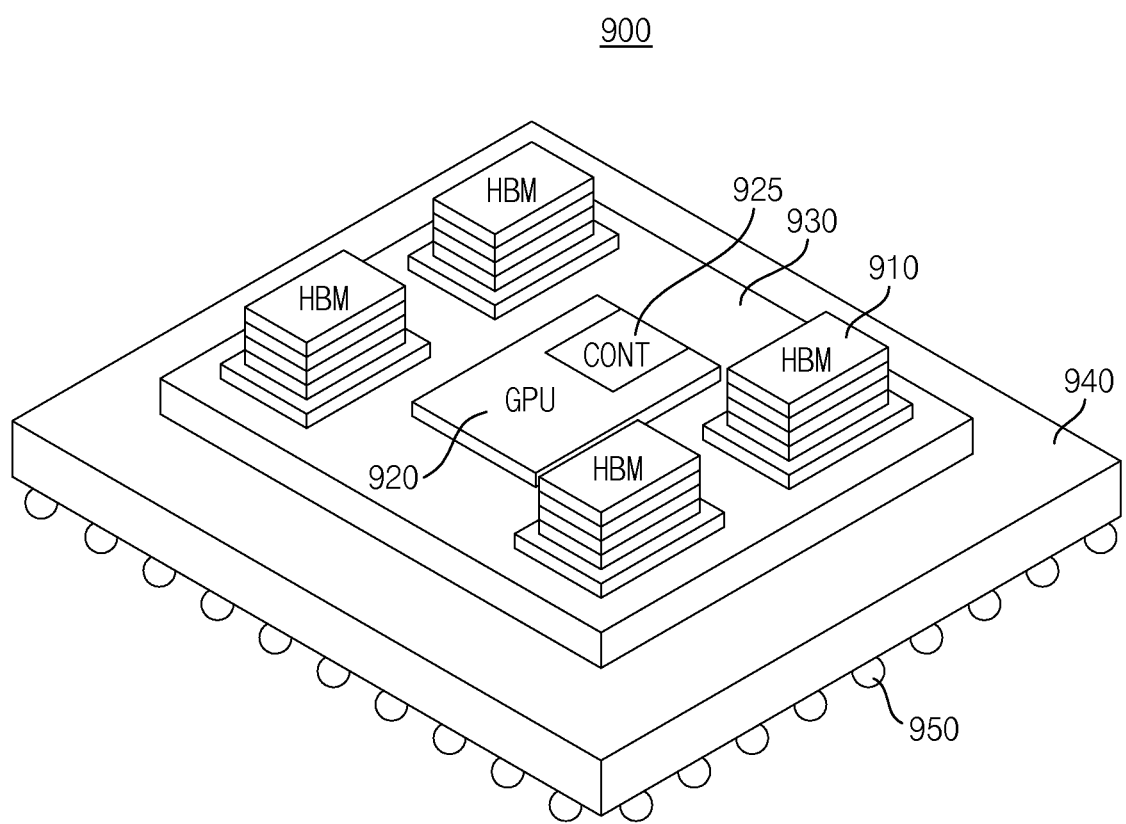
FIG. 27 is an isometric projection diagram illustrating a semiconductor package including the stacked memory device according to an embodiment.

FIG. 27 illustrates a semiconductor package including the stacked memory device according to an embodiment.

Referring to FIG. 27, a semiconductor package 900 may include one or more stacked memory devices 910 and a GPU 920, where the GPU 920 includes a memory controller (CONT) 925.

The stacked memory devices 910 and the GPU 920 may be mounted on an interposer 930, and the interposer 930 on which the stacked memory devices 910 and the GPU 920 are mounted may be mounted on a package substrate 940. The package substrate 940 may be mounted on solder balls 950, without limitation thereto.

Each of the stacked memory devices 910 may be implemented in various forms, and may be or include a memory device in a high-bandwidth memory (HBM) form in which a plurality of layers are stacked. Accordingly, each of the stacked memory devices 910 may include at least one buffer die and a plurality of memory dies, where each of the plurality of memory dies may include a cell core and a cell core ECC engine, and the buffer die may include a via ECC engine, a transmitter and a receiver.

The plurality of stacked memory devices 910 may be mounted on the interposer 930, without limitation thereto, and the GPU 920 may communicate with the plurality of stacked memory devices 910. For example, each of the stacked memory devices 910 and the GPU 920 may include a physical region, and communications may be performed between the stacked memory devices 910 and the GPU 920 through the physical regions.

The present disclosure may be applied to various electronic devices and systems such as memory devices and memory systems including a transmitter for ultra-high speed data transmission. For example, the present disclosure may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a video player, a camcorder, a navigation device, a wearable device, an internet of things (IoT) device, an internet of everything (IoE) device, an e-book reader, a virtual reality (VR) device, an augmented reality (AR) device, a robotic device, a drone, a media server, a network communications device, or the like.

The foregoing description of illustrative embodiments is by way of example and is not to be construed as limiting thereof. Although illustrative embodiments have been described, those of ordinary skill in the pertinent art will readily appreciate that many modifications are possible in the disclosed and other embodiments without materially departing from the novel teachings of the present disclosure. Accordingly, all such modifications are intended to be included within the scope of the present disclosure as defined in the appended claims.

What is claimed is:

1. A transmitter comprising:
a pattern generator configured to generate test data having a predetermined pattern;
a data generator configured to receive the generated test data and a data signal, generate retimed test data and a retimed data signal by adjusting a delay amount of each of the test data and the data signal based on adjusted clock signals;
a serializer configured to generate a serial data signal by serializing the retimed data signal based on multi-phase clock signals;
a transmission driver configured to generate an output data signal based on the serial data signal and transmit the output data signal through a channel; and
a feedback circuit configured to detect a setup margin and a hold margin of the retimed test data through a separate path different from a path of the retimed data signal, and configured to generate the adjusted clock signals by adjusting delay amounts of the multi-phase clock signals based on the detected setup margin and the detected hold margin of the retimed test data,
wherein the feedback circuit comprises:
at least one dummy multiplexer configured to provide at least one output signal by sequentially selecting at least one portion from among test bits of the retimed test data based on the multi-phase clock signals;
a detection circuit configured to detect the setup margin and the hold margin of the retimed test data based on the at least one output signal and a strobe signal selected from among test bits of the test data, and configured to generate a detection signal indicating the detected setup margin and the detected hold margin of the retimed test data; and
a clock timing adjuster configured to generate the adjusted clock signals by adjusting the delay amounts of the multi-phase clock signals based on the detection signal.

2. The transmitter of claim 1,
wherein each of the retimed test data and the retimed data signal have a same adjusted setup margin and a same adjusted hold margin,
wherein the at least one dummy multiplexer comprises:
a first dummy multiplexer configured to provide a first output signal by sequentially selecting a first portion from among test bits of the retimed test data based on the multi-phase clock signals; and
a second dummy multiplexer configured to provide a second output signal by sequentially selecting a second portion from among the test bits of the retimed test data based on the multi-phase clock signals, the second portion being different from the first portion;
wherein the detection circuit is further configured to detect the setup margin and the hold margin of the retimed test data based on the first output signal, the second output signal and the strobe signal and configured to generate a detection signal indicating the detected setup margin and the detected hold margin of the retimed test data;
wherein the feedback circuit further comprises:
a strobe signal selector configured to select one from among the test bits of the retimed test data as the strobe signal; and
a control logic configured to generate a delay control signal based on the detection signal,
wherein the clock timing adjuster is further configured to generate the adjusted clock signals by adjusting the delay amounts of the multi-phase clock signals based on the delay control signal.

3. The transmitter of claim 2,
wherein the first dummy multiplexer is configured to sequentially select the first portion from among the test bits based on a first clock signal and a second clock signal of the multi-phase clock signals, and the first clock signal and the second clock signal have a phase difference of 90 degrees with respect to each other, and
wherein the second dummy multiplexer is configured to sequentially select the second portion from among the test bits based on the first clock signal and the second clock signal of the multi-phase clock signals.

4. The transmitter of claim 2, wherein the detection circuit comprises:
a first XOR gate configured to generate a third output signal by performing an XOR operation on the first output signal and the strobe signal;
a second XOR gate configured to generate a fourth output signal by performing an XOR operation on the second output signal and the strobe signal;
a first integrator configured to generate a first voltage signal corresponding to an analog signal by integrating the third output signal;
a second integrator configured to generate a second voltage signal corresponding to an analog signal by integrating the fourth output signal; and
a comparator configured to generate the detection signal by subtracting the second voltage signal from the first voltage signal.

5. The transmitter of claim 4, wherein:
the third output signal has a first duty indicating a first skew between the retimed test data and the multi-phase clock signals; and
the fourth output signal has a second duty indicating a second skew between the retimed test data and the multi-phase clock signals.

6. The transmitter of claim 4, wherein the control logic is configured to determine at least one lock point, from among a plurality of skews, at which the first voltage signal and the second voltage signal intersect each other and the detection signal has a positive slope.

7. The transmitter of claim 6, wherein the retimed data signal has a target setup margin and a target hold margin at the lock point.

8. The transmitter of claim 6, wherein the lock point varies based on the strobe signal selected by the strobe signal selector.

9. The transmitter of claim 4, wherein, in response to the detection signal indicating that the first voltage signal is greater than the second voltage signal,
the control logic is configured to generate the delay control signal such that the delay amount of the multi-phase clock signals decreases, and
the clock timing adjuster is configured to generate the adjusted clock signals by decreasing the delay amount of the multi-phase clock signals in response to the delay control signal.

10. The transmitter of claim 4, wherein, in response to the detection signal indicating that the first voltage signal is smaller than the second voltage signal,
the control logic is configured to generate the delay control signal such that the delay amount of the multi-phase clock signals increases, and
the clock timing adjuster is configured to generate the adjusted clock signals by increasing the delay amount of the multi-phase clock signals in response to the delay control signal.

11. The transmitter of claim 4, wherein the control logic is configured to:
adjust the delay control signal such that the delay amount of the multi-phase clock signals is adjusted until the detection signal indicating the first voltage signal matches the second voltage signal; and
lock the delay control signal in response to the first voltage signal matching the second voltage signal.

12. The transmitter of claim 2, wherein the clock timing adjuster includes one of a plurality of voltage-controlled delay lines and a plurality of digitally-controlled delay lines.

13. The transmitter of claim 1, wherein the data generator comprises:
a first shift register block including a plurality of first shift registers configured to generate the retimed data signal by delaying data bits of the data signal in parallel based on a first adjusted clock signal and a second adjusted clock signal of the adjusted clock signals, the first adjusted clock signal and the second adjusted clock signal having a phase difference of 180 degrees with respect to each other; and
a second shift register block including a plurality of second shift registers configured to generate the retimed test data by delaying test bits of the test data in parallel based on the first adjusted clock signal and the second adjusted clock signal.

14. The transmitter of claim 13, wherein:
each of the plurality of first shift registers includes a plurality of first latches which are connected in cascade,
first odd latches of the plurality of first latches are configured to receive the first adjusted clock signal, and
first even latches of the plurality of first latches are configured to receive the second adjusted clock signal; and
each of the plurality of second shift registers includes a plurality of second latches which are connected in cascade,
second odd latches of the plurality of second latches are configured to receive the first adjusted clock signal, and
second even latches of the plurality of second latches are configured to receive the second adjusted clock signal.

15. The transmitter of claim 1,
wherein the transmitter is included in a data input/output buffer of a volatile memory device,
wherein the volatile memory device further includes a memory cell array, and
wherein the data input/output buffer is configured to transmit a data read from the memory cell array to a memory controller.

16. A storage device comprising:
a processor configured to generate an input data signal; and
a transmitter configured to generate test data, configured to generate an output data signal having a target setup margin and a target hold margin by adjusting a delay amount of the input data signal based on the test data, and configured to transmit the output data signal to a host through a link,
wherein the transmitter comprises:
a pattern generator configured to generate the test data having a predetermined pattern;
a data generator configured to generate a retimed data signal and a retimed test data by adjusting a delay amount of each of the input data signal and the test data based on adjusted clock signals;
a serializer configured to generate a serial data signal by serializing the retimed data signal based on multi-phase clock signals;
a transmission driver configured to generate the output data signal based on the serial data signal and transmit the output data signal through the link; and
a feedback circuit configured to detect a setup margin and a hold margin of the retimed test data through a separate path different from a path of the retimed data signal, and configured to generate the adjusted clock signals by adjusting delay amounts of the multi-phase clock signals based on the detected setup margin and the detected hold margin of the retimed test data,
wherein the feedback circuit comprises:
at least one dummy multiplexer configured to provide at least one output signal by sequentially selecting at least one portion from among test bits of the retimed test data based on the multi-phase clock signals;
a detection circuit configured to detect the setup margin and the hold margin of the retimed test data based on the at least one output signal and a strobe signal selected from among test bits of the test data, and configured to generate a detection signal indicating the detected setup margin and the detected hold margin of the retimed test data; and
a clock timing adjuster configured to generate the adjusted clock signals by adjusting the delay amounts of the multi-phase clock signals based on the detection signal.

17. The storage device of claim 16,
wherein each of the retimed data signal and the retimed test data have a setup margin and a hold margin that are adjusted,
wherein the at least one dummy multiplexer comprises:
a first dummy multiplexer configured to provide a first output signal by sequentially selecting a first portion from among test bits of the retimed test data based on the multi-phase clock signals; and
a second dummy multiplexer configured to provide a second output signal by sequentially selecting a second portion from among the test bits of the retimed test data based on the multi-phase clock signals, the second portion being different from the first portion, wherein the detection circuit is further configured to detect the setup margin and the hold margin of the retimed test data based on the first output signal, the second output signal and the strobe signal and configured to generate a detection signal indicating the detected setup margin and the detected hold margin of the retimed test data, wherein the feedback circuit further comprises:
  a strobe signal selector configured to select one from among the test bits of the retimed test data as the strobe signal; and
  control logic configured to generate a delay control signal based on the detection signal, wherein the clock timing adjuster is further configured to generate the adjusted clock signals by adjusting the delay amounts of the multi-phase clock signals based on the delay control signal.

18. The storage device of claim 16, wherein the storage device is configured to communicate with the host based on a peripheral component interconnect express (PCIe) protocol.

19. The storage device of claim 16, wherein:
  the storage device is configured to communicate with the host based on a universal flash storage (UFS) protocol;
  the transmitter is included in a physical layer of an interface circuit of the storage device, and
  the physical layer corresponds to a mobile industry processor interface (MIPI) M-PHY.

20. A transmitter for ultra-high speed, the transmitter comprising:
  a pattern generator configured to generate test data having a predetermined pattern;
  a data generator configured to generate a retimed data signal and a retimed test data by adjusting a delay amount of each of an input data signal and the test data based on adjusted clock signals, each of the retimed data signal and the retimed test data having a setup margin and a hold margin that are adjusted;
  a serializer configured to generate a serial data signal by serializing the retimed data signal based on multi-phase clock signals;
  a transmission driver configured to generate an output data signal based on the serial data signal and transmit the output data signal through a channel; and
  a feedback circuit configured to detect the setup margin and the hold margin of the retimed test data through a separate path different from a path of the retimed data signal and configured to generate the adjusted clock signals signal by adjusting delay amounts of the multi-phase clock signals based on the detected setup margin and the detected hold margin of the retimed test data, and wherein the feedback circuit comprises:
  a first dummy multiplexer configured to provide a first output signal by sequentially selecting a first portion from among test bits of the retimed test data based on the multi-phase clock signals;
  a second dummy multiplexer configured to provide a second output signal by sequentially selecting a second portion from among the test bits of the retimed test data based on the multi-phase clock signals, the second portion being different from the first portion;
  a detection circuit configured to detect the setup margin and the hold margin of the retimed test data based on the first output signal, the second output signal and a strobe signal and configured to generate a detection signal indicating the detected setup margin and the detected hold margin of the retimed test data, the strobe signal being selected from among test bits of the test data;
  a control logic configured to generate a delay control signal based on the detection signal; and
  a clock timing adjuster configured to generate the adjusted clock signals by adjusting the delay amounts of the multi-phase clock signals based on the delay control signal.

* * * * *